United States Patent
Bao et al.

(10) Patent No.: US 12,176,250 B2
(45) Date of Patent: Dec. 24, 2024

(54) METAL GATE BOUNDARY FOR TRANSISTOR SCALING

(71) Applicant: INTERNATIONAL BUSINESS MACHINES CORPORATION, Armonk, NY (US)

(72) Inventors: Ruqiang Bao, Niskayuna, NY (US); Dechao Guo, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 403 days.

(21) Appl. No.: 17/660,427

(22) Filed: Apr. 25, 2022

(65) Prior Publication Data

US 2023/0343650 A1    Oct. 26, 2023

(51) Int. Cl.
| | |
|---|---|
| *H01L 21/8238* | (2006.01) |
| *H01L 21/28* | (2006.01) |
| *H01L 27/092* | (2006.01) |
| *H01L 29/06* | (2006.01) |
| *H01L 29/423* | (2006.01) |
| *H01L 29/49* | (2006.01) |
| *H01L 29/66* | (2006.01) |
| *H01L 29/786* | (2006.01) |

(52) U.S. Cl.
CPC ........... *H01L 21/823842* (2013.01); *H01L 21/28088* (2013.01); *H01L 27/092* (2013.01); *H01L 29/0665* (2013.01); *H01L 29/42392* (2013.01); *H01L 29/4908* (2013.01); *H01L 29/66742* (2013.01); *H01L 29/78696* (2013.01)

(58) Field of Classification Search
None
See application file for complete search history.

(56) References Cited

U.S. PATENT DOCUMENTS

| | | |
|---|---|---|
| 7,872,303 B2 | 1/2011 | Chan |
| 8,941,184 B2 | 1/2015 | Ando |
| (Continued) | | |

FOREIGN PATENT DOCUMENTS

| | | |
|---|---|---|
| CN | 103579113 B | 2/2017 |
| TW | 202127631 A | 7/2021 |
| TW | 202137289 A | 10/2021 |

OTHER PUBLICATIONS

Bao et al., "Multiple-Vt Solutions in Nanosheet Technology for High Performance and Low Power Applications," 2019 IEEE International Electron Devices Meeting (IEDM), 2019, 5 pages.

(Continued)

*Primary Examiner* — Bo B Jang
(74) *Attorney, Agent, or Firm* — Yuanmin Cai

(57) ABSTRACT

Embodiments of present invention provide a method of forming a transistor structure. The method includes receiving a first and a second gate region of a first and a second transistor, the second transistor being adjacent to the first transistor; forming a first work-function metal surrounding the first gate region; truncating the first work-function metal at a first boundary between the first transistor and the second transistor; forming one or more work-function metals surrounding the first gate region; truncating the one or more work-function metals at a second boundary between the first boundary and the second transistor; and forming another work-function metal surround the first and second gate regions. A transistor structure formed thereby is also provided.

18 Claims, 19 Drawing Sheets

(56) References Cited

U.S. PATENT DOCUMENTS

| | | |
|---|---|---|
| 9,105,745 B2 | 8/2015 | Ando |
| 9,293,551 B2 | 3/2016 | Fan |
| 9,502,265 B1 | 11/2016 | Ching-Hong |
| 9,799,656 B2 | 10/2017 | Bao |
| 9,837,416 B2 | 12/2017 | Walke |
| 9,997,519 B1 | 6/2018 | Bao |
| 10,002,791 B1 | 6/2018 | Bao |
| 10,319,846 B1 | 6/2019 | Ando |
| 10,510,620 B1 | 12/2019 | Chanemougame |
| 10,985,075 B2 | 4/2021 | Bao |
| 11,393,916 B2 * | 7/2022 | Colombeau ....... H01L 29/66742 |
| 11,527,535 B2 * | 12/2022 | Frougier ........... H01L 29/66545 |
| 2019/0181051 A1 | 6/2019 | Anderson |
| 2020/0273953 A1 | 8/2020 | Chu |

OTHER PUBLICATIONS

Chang et al., "Enabling Multiple-Vt Device Scaling for CMOS Technology beyond 7nm Node", © 2020 IEEE, 2 pages.

Disclosed Anonymously, "High work function metal gate for low PFET Vt", IP.com No. IPCOM000256933D, Jan. 9, 2019, 5 pages.

Disclosed Anonymously, "Multiple VT for Gate-All-Around FETs with Suspension Thicknesses (Tsus) Modulation", IP.com No. IPCOM000255894D, Oct. 19, 2018, 4 pages.

Wu, "Key Technology Enablers of Innovations in the AI and 5G Era", © 2019 IEEE, IEDM19-863, pp. 36.3.1-36.3.4.

Notification of Transmittal of the International Search Report and the Written Opinion of the International Searching Authority, or the Declaration, Date of mailing Jun. 16, 2023, International application No. PCT/EP2023/056445, 14 pages.

* cited by examiner

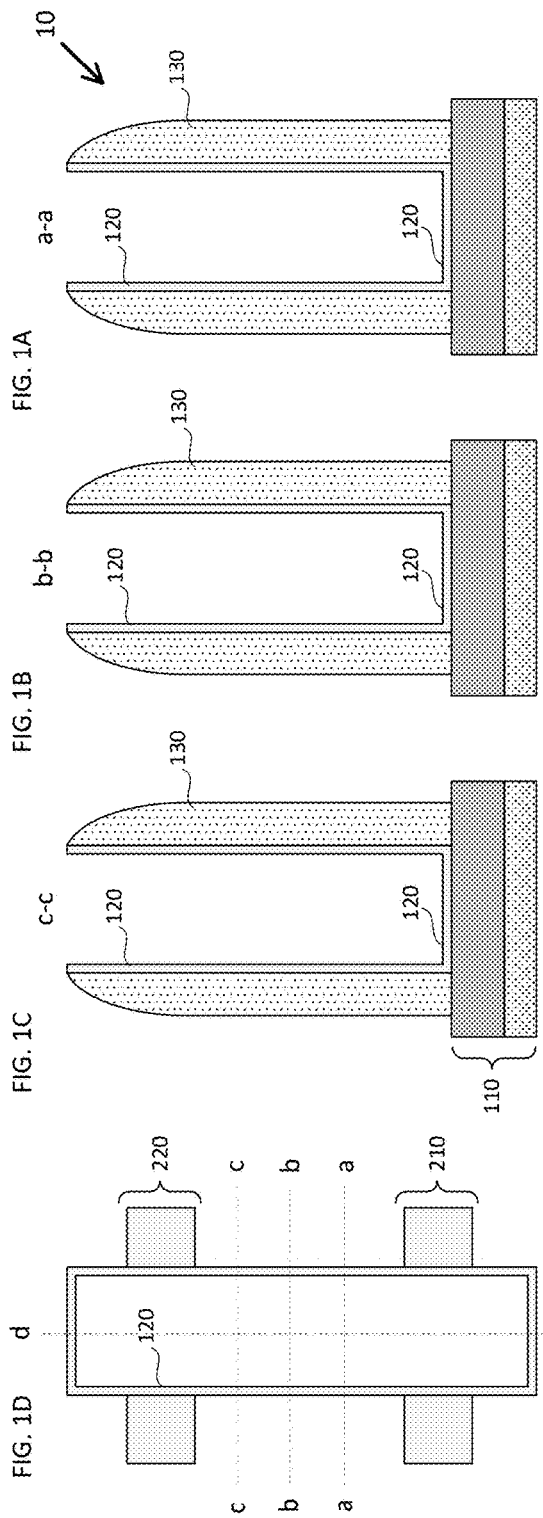
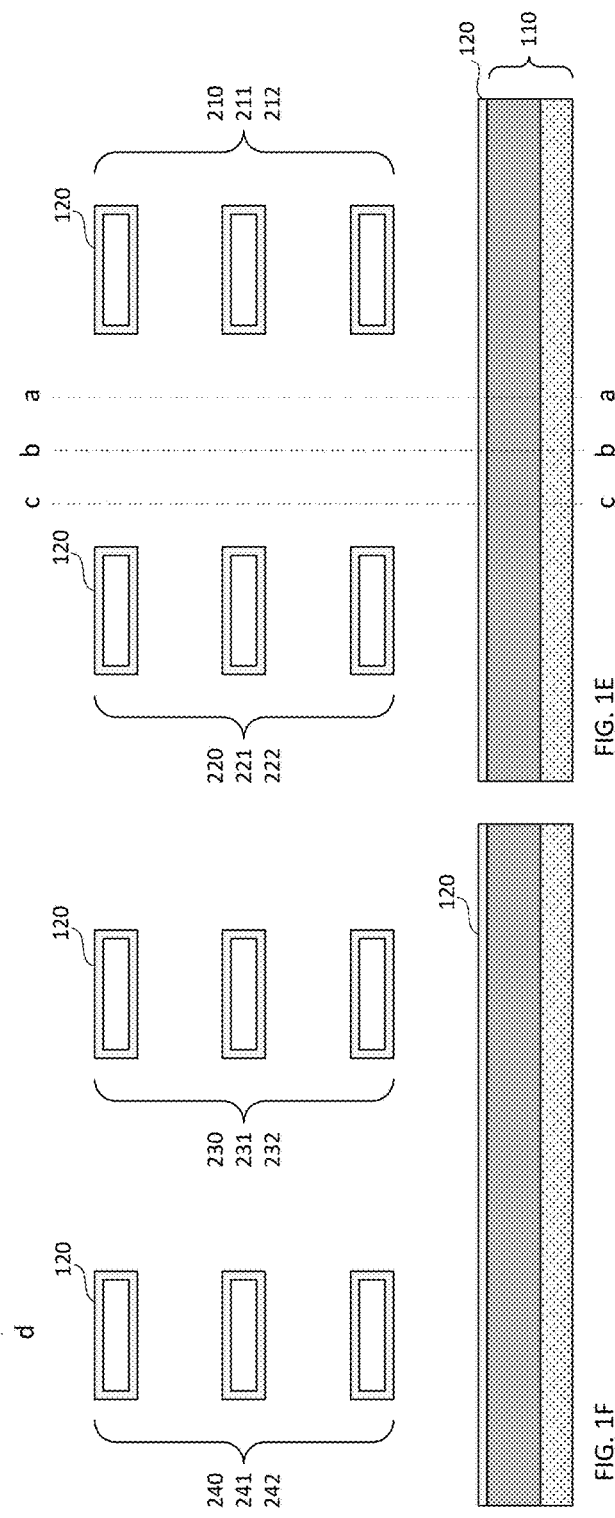

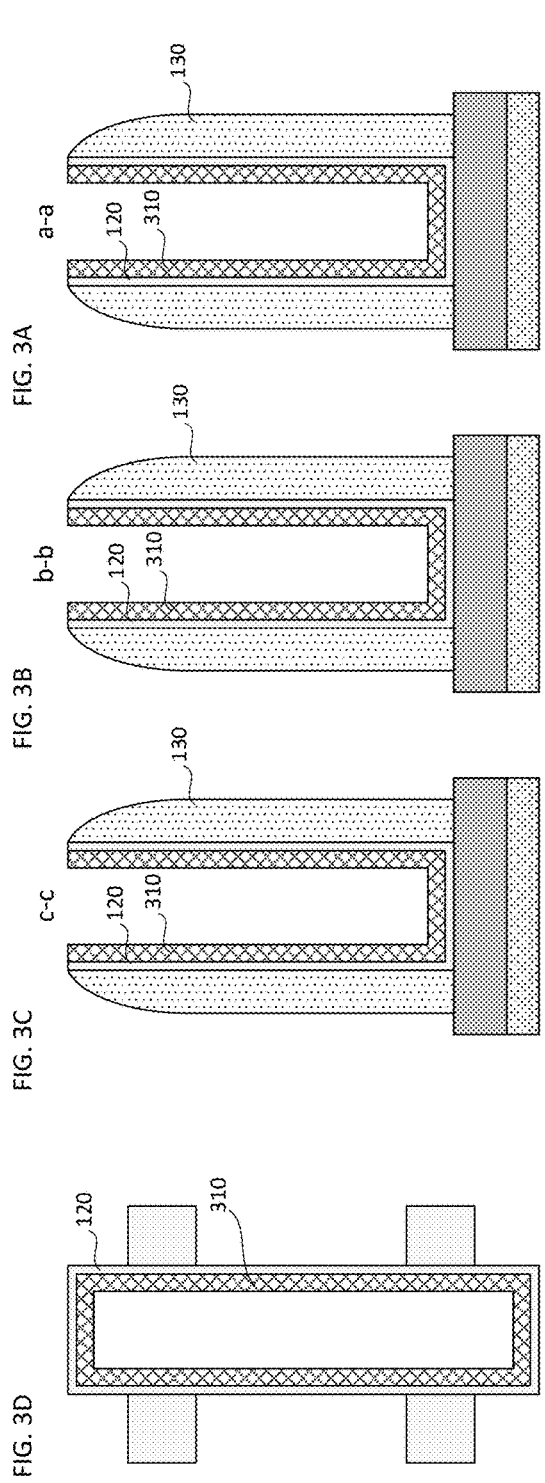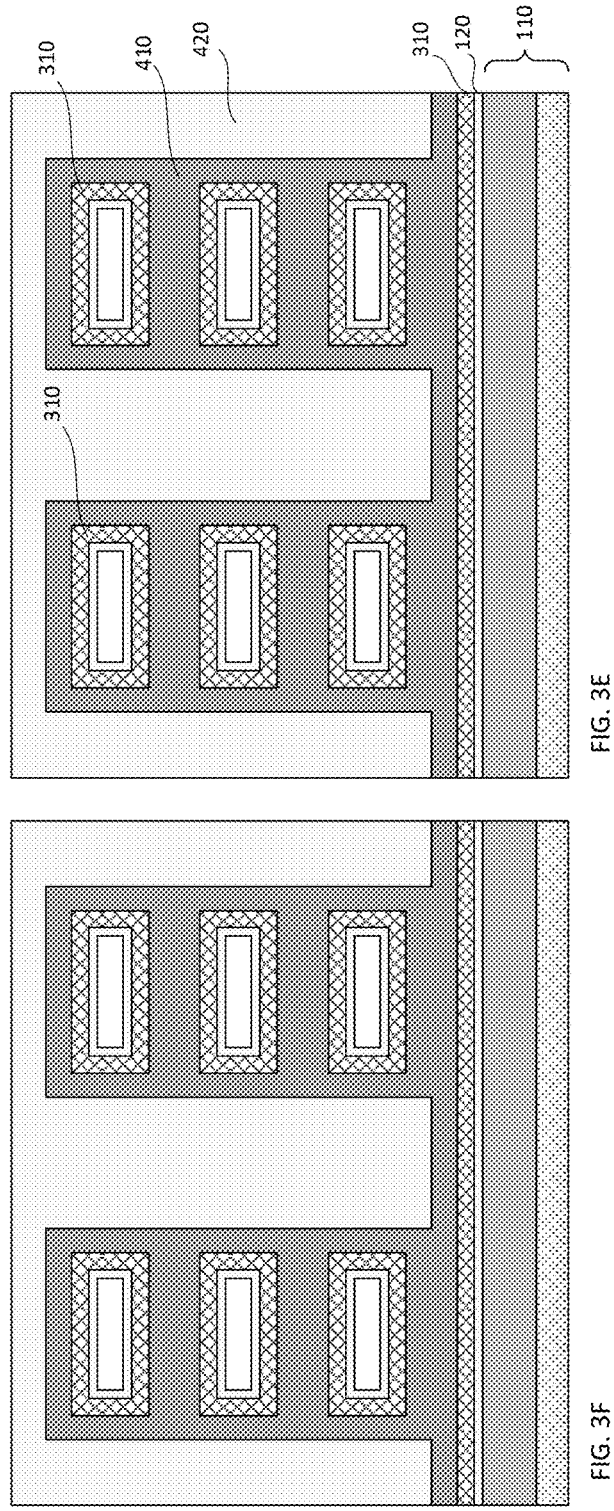

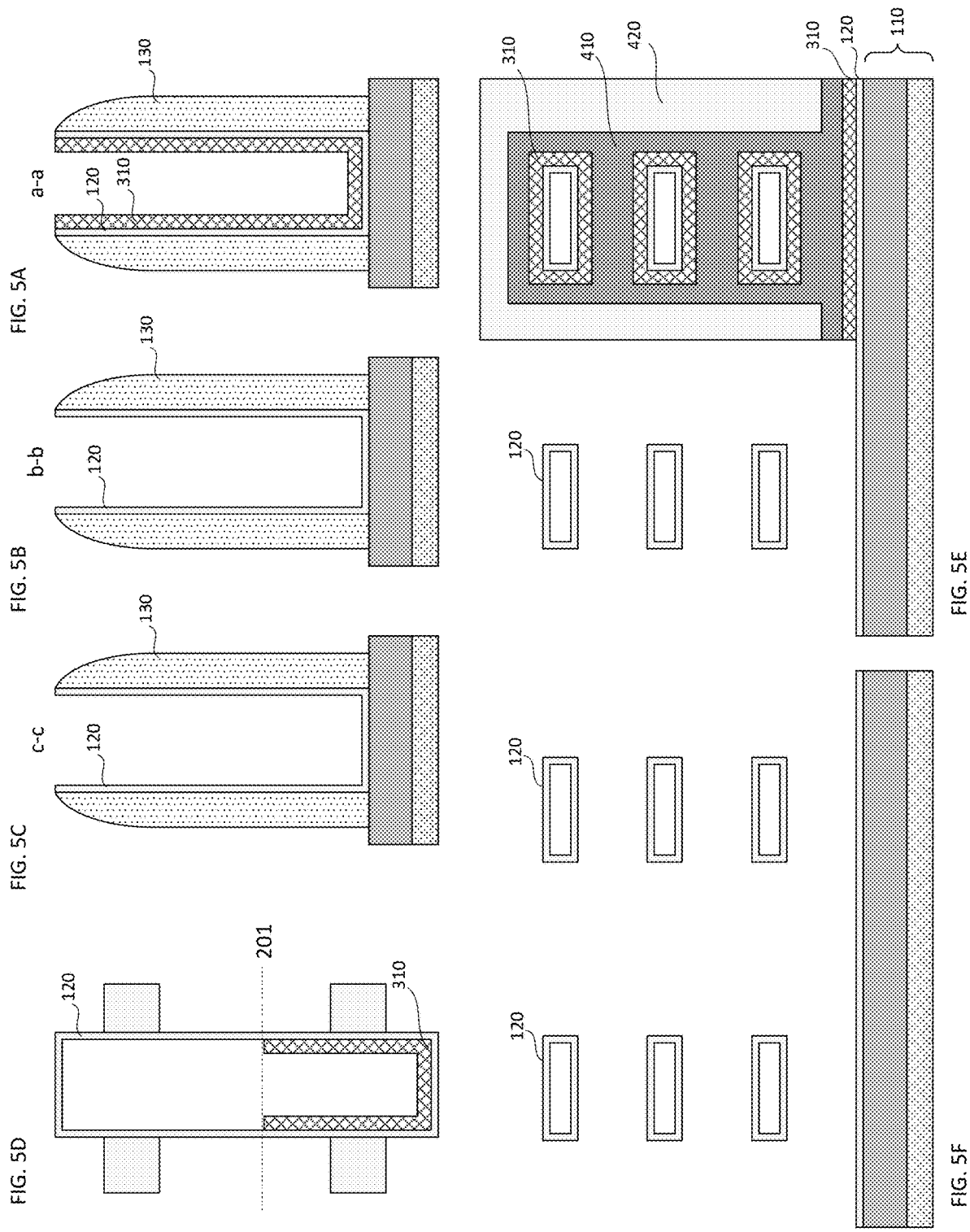

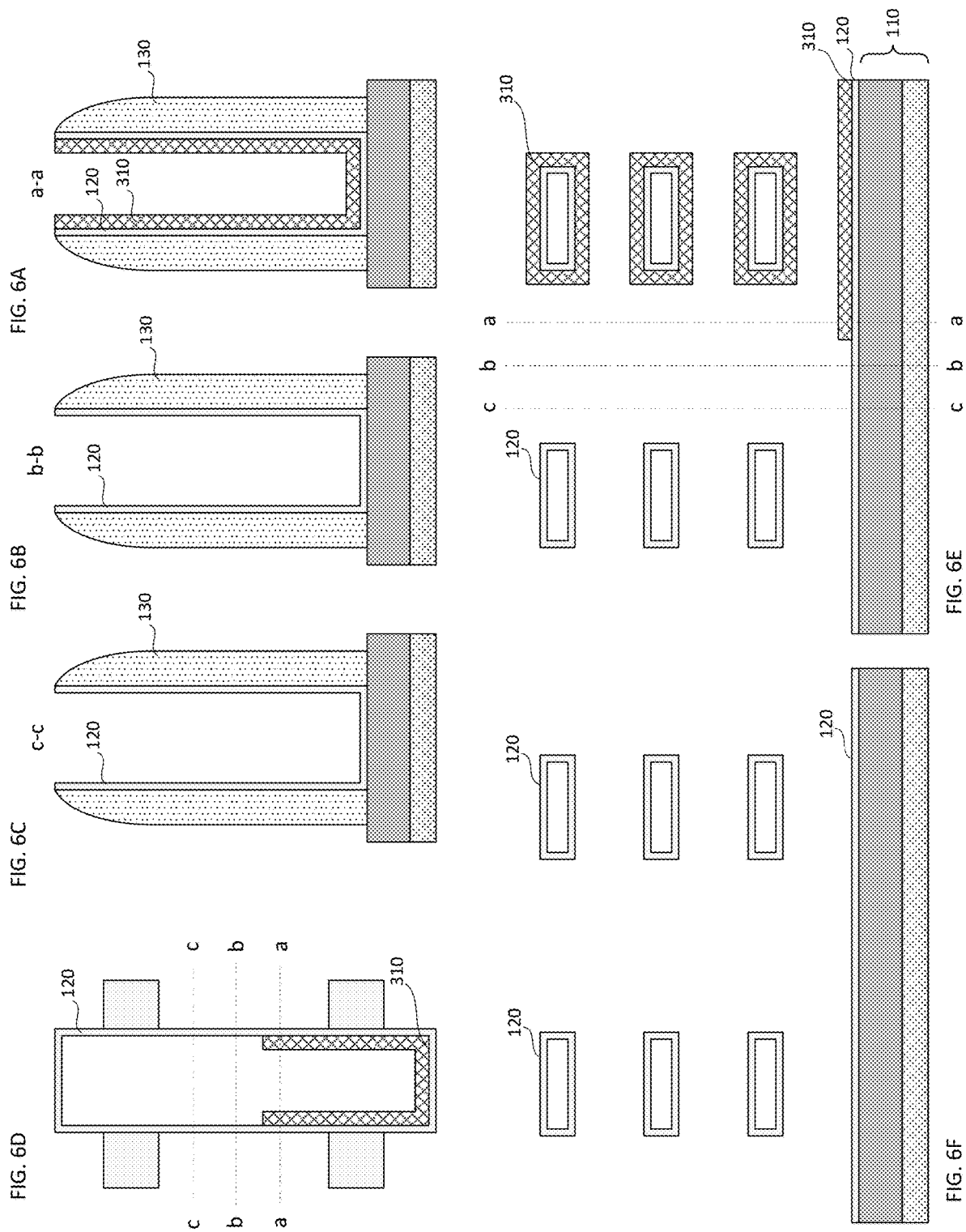

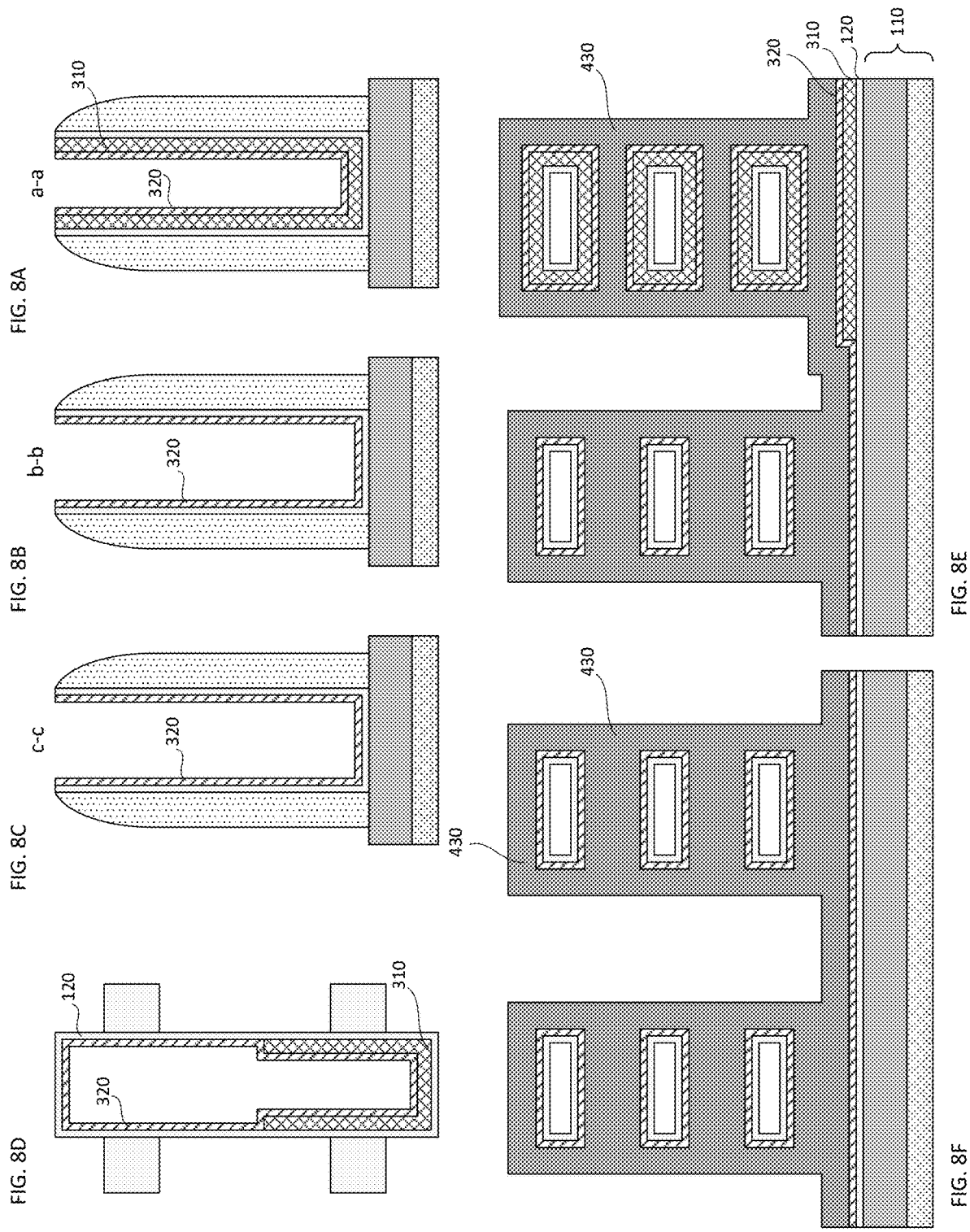

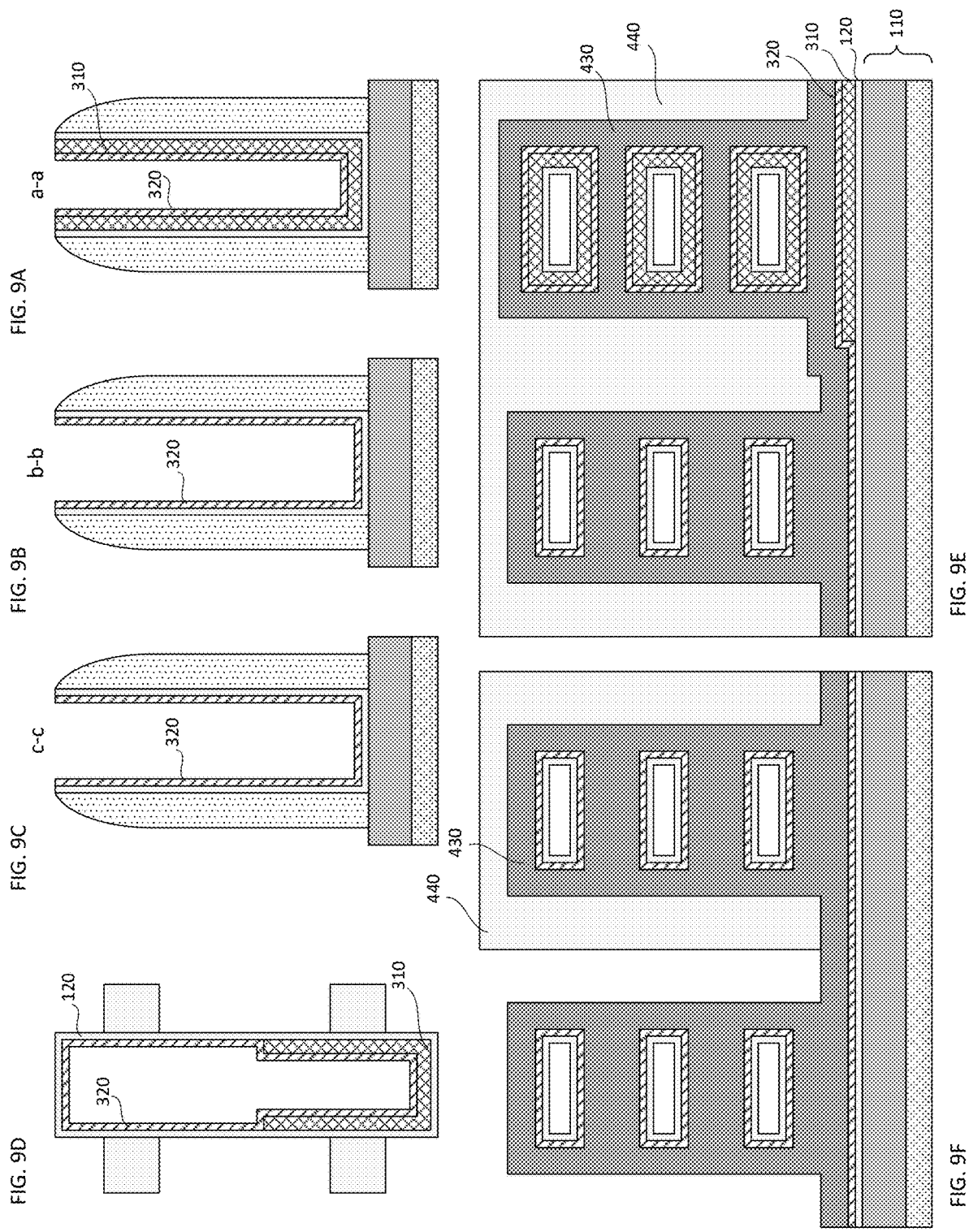

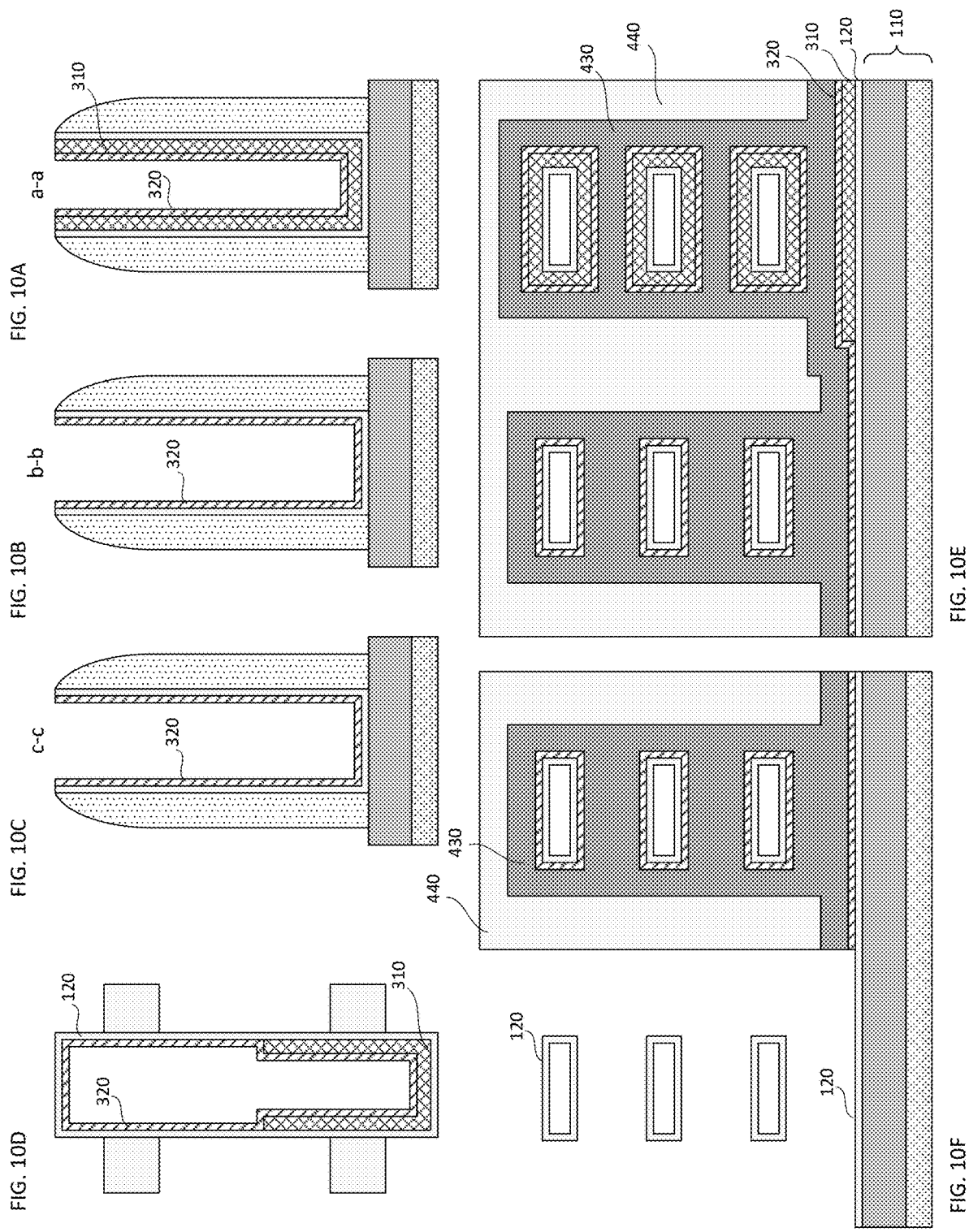

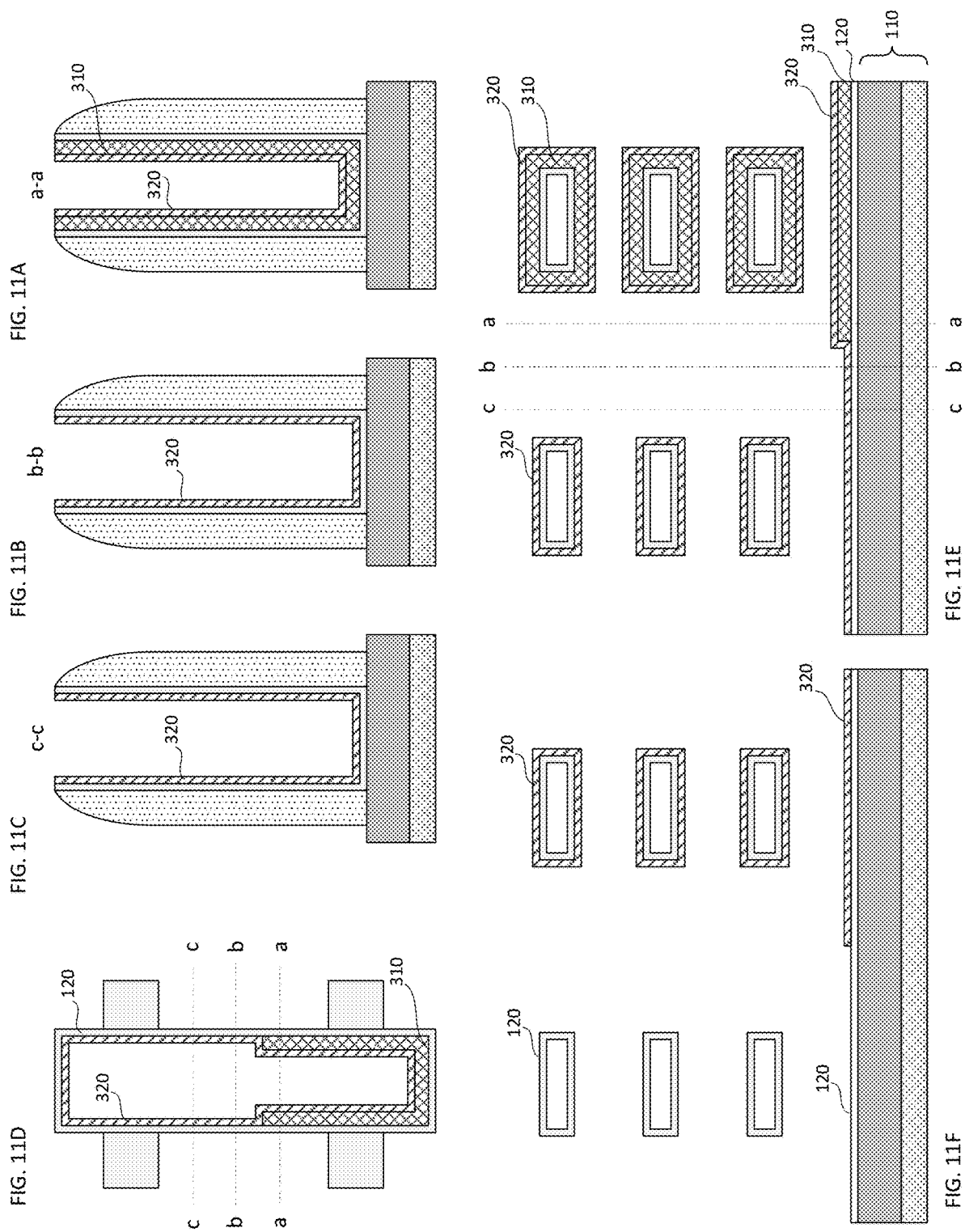

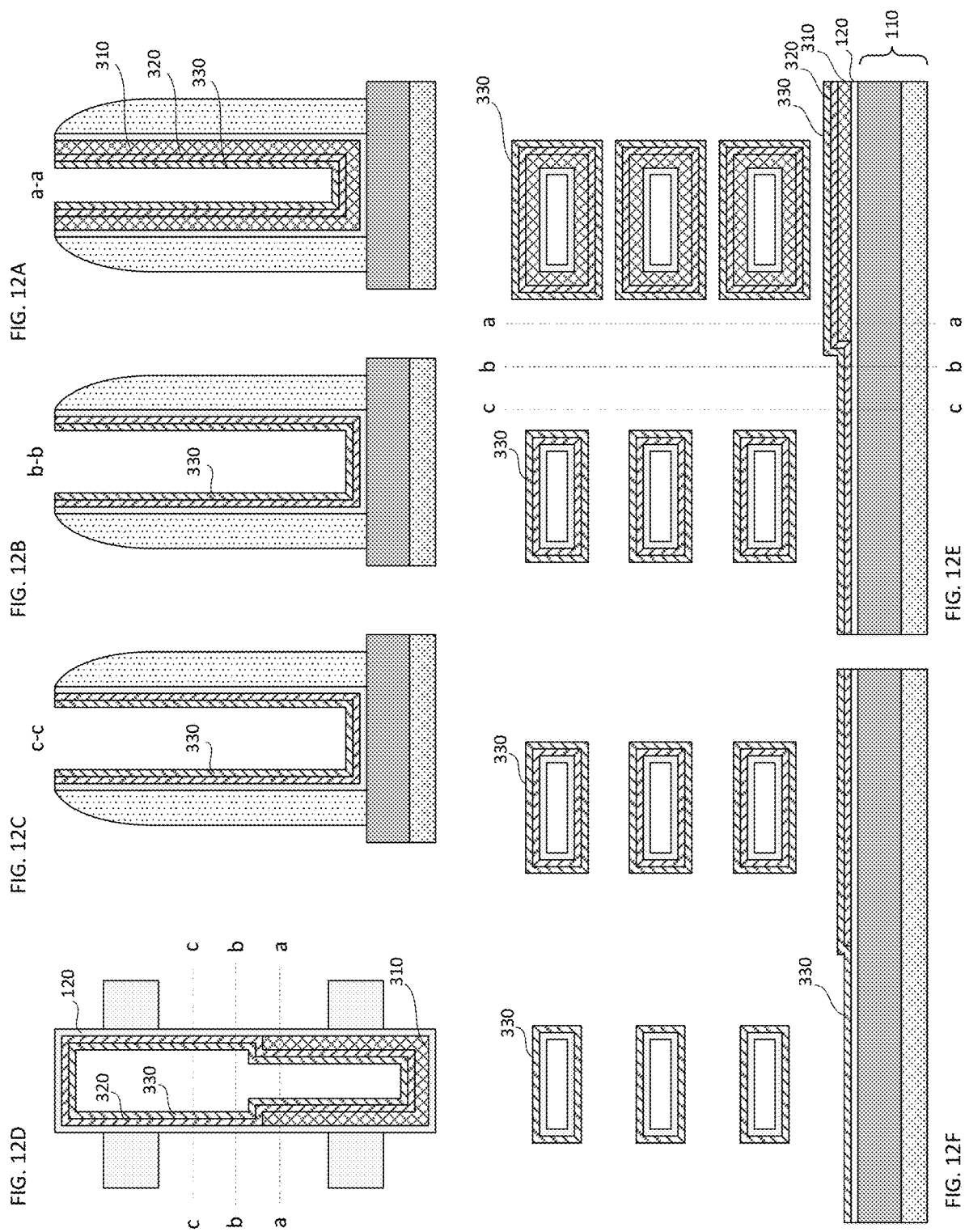

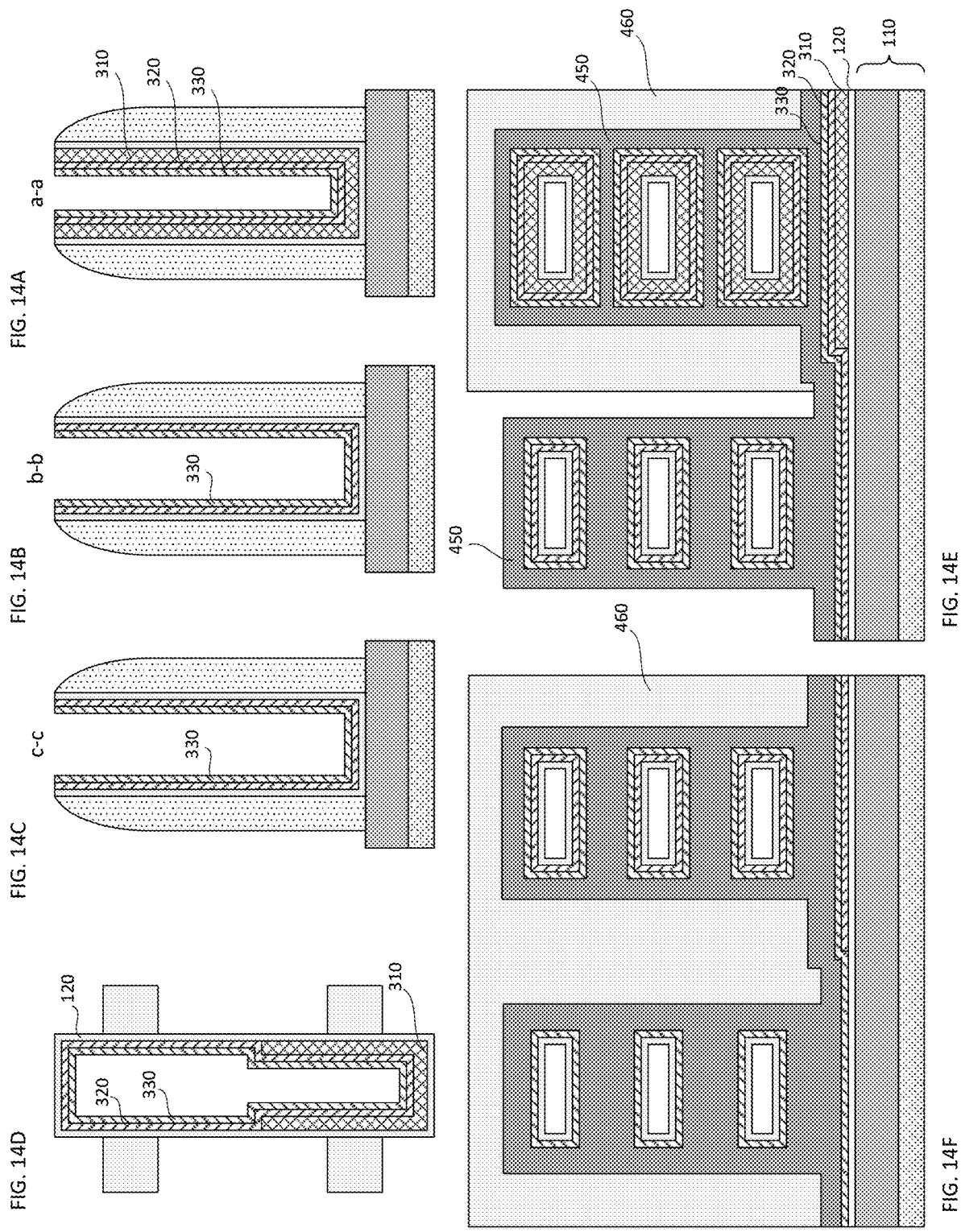

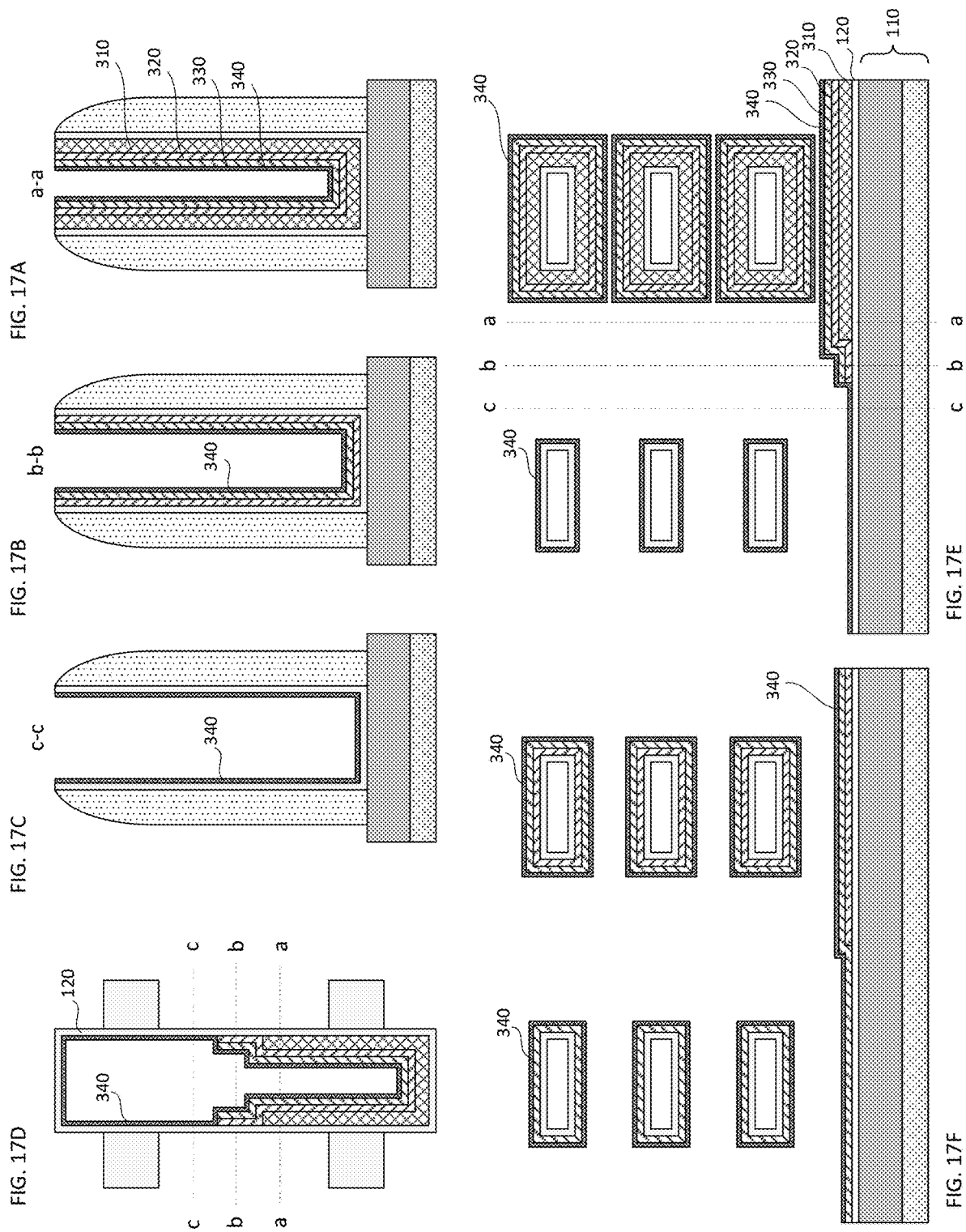

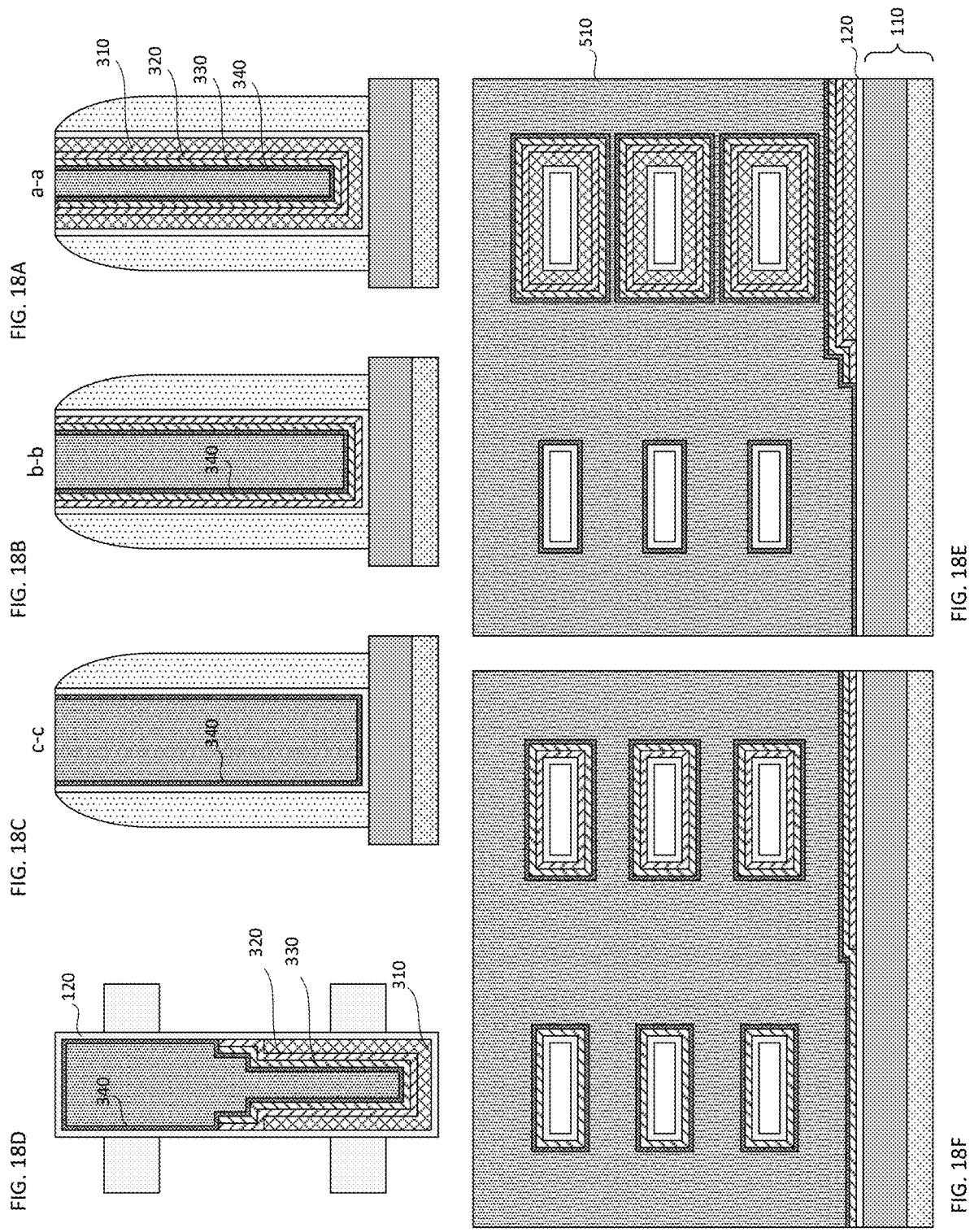

METAL GATE BOUNDARY FOR TRANSISTOR SCALING

BACKGROUND

The present application relates to manufacturing of semiconductor integrated circuits. More particularly, it relates to a metal gate boundary scheme and method of using the scheme for making transistor structure.

With the advancement of semiconductor manufacturing capability, semiconductor devices are moving toward smaller and smaller node such as, for example 7-nm node and beyond. Field-effect-transistors (FETs) are aggressively scaled in order to fit into reduced footprint or real estate, as defined by the node, with increased device density.

In terms of structures, FETs may include, for example, planar FETs, fin-type FETs, vertical FETs, nanosheet transistors, and nanowire transistors. FETs may also include, in terms of types, a p-type transistor (PFET) and an n-type transistor (NFET) that use different carriers, either holes or electrons, for carrying current. PFET and NFET may often use different work-function metals to achieve different operational threshold. For example, a PFET may use one set of work-function metals and an NFET may use another set of work-function metals that may be entirely or partially different from the set of work-function metals used for the PFET.

When a PFET and an NFET are manufactured together adjacent to each other, the PFET and NFET may share some of their work-function metals due to various reasons such as, for example, for simplifying their manufacturing process. This results in using multiple layers of work-function metals for one FET, and/or different number of layers for PFET and for NFET. Sometimes, different thresholds may be needed for a same type of FET (PFET or NFET) as well.

On the other hand, with the transistor scaling, in a replacement-metal-gate (RMG) process, gate opening for forming work-function metals over a channel region of a transistor may be limited. The use of multiple layers of work-function metals, particularly for PFET that uses multiple work-function metals, may result in the narrowing down of the gate opening, and ultimately pinch-off, increasing the difficulty in forming transistors with different thresholds.

SUMMARY

Embodiments of present invention provide a transistor structure. The structure includes a first transistor having a first gate structure; and the first gate structure having two or more work-function metals, wherein one or more of the two or more work-function metals are truncated at a first boundary and a second boundary.

In one embodiment, the structure further includes a second transistor adjacent to the first transistor, the second transistor having a second gate structure, wherein the first and second boundaries are between the first and second transistors.

In one aspect, the first transistor is a p-type transistor, and the second transistor is an n-type transistor.

In one embodiment, the two or more work-function metals include a first and a second work-function metal, where the first work-function metal is truncated at the first boundary and the second work-function metal is truncated at the second boundary, the second boundary being between the first boundary and the second transistor.

In another embodiment, the second work-function metal is formed on top of the first work-function metal, and wherein a distance between two truncated ends of the second work-function metal, when viewed from a top of the first gate structure, is larger than a width of a gap formed by the second work-function metal with the gap being directly above a gate region of the first gate structure.

In one aspect, the distance between the two truncated ends of the second work-function metal is sufficiently large to allow an organic planarization layer to fill between the two truncated ends without creating void. In another aspect, the width of the gap formed by the second work-function metal directly above the gate region of the first gate structure is sufficiently narrow to cause an organic planarization layer to pinch off and not able to fill the gap without creating void.

In one embodiment, the two or more work-function metals further include one or more additional work-function metals between the first and second work-function metals, wherein the second work-function metal and one or more of the one or more additional work-function metals are truncated at the second boundary.

Embodiments of present invention also provide a method of manufacturing a transistor structure. The method includes receiving a first gate region of a first transistor and a second gate region of a second transistor, the first transistor being adjacent to the second transistor; forming a first work-function metal surrounding the first gate region; truncating the first work-function metal at a first boundary between the first transistor and the second transistor; forming one or more work-function metals surrounding the first gate region; truncating the one or more work-function metals at a second boundary between the first boundary and the second transistor; and forming another work-function metal surrounding the first and second gate regions.

In one embodiment, truncating the one or more work-function metals includes forming an organic planarization layer (OPL) in a gap formed by the one or more work-function metals in an area between the first boundary and the second boundary, the gap being sufficiently large such that the OPL being able to substantially fill up the gap without creating void.

In another embodiment, a gap formed by the one or more work-function metals directly above the first gate region of the first transistor is sufficiently narrow to cause an organic planarization layer to pinch off and not able to fill the gap without creating void.

In one embodiment, truncating the one or more work-function metals includes selectively etching the one or more work-function metals between the second boundary and the second transistor with an organic planarization layer protecting the one or more work-function metals between the first boundary and the second boundary from being etched.

In another embodiment, truncating the first work-function metal includes forming an organic planarization layer (OPL) in a gap formed by the first work-function metal in an area between the first transistor and the first boundary, the gap being sufficiently large such that the OPL is able to substantially fill up the gap without creating void.

BRIEF DESCRIPTION OF THE DRAWINGS

The present invention will be understood and appreciated more fully from the following detailed description of embodiments of present invention, taken in conjunction with accompanying drawings of which:

FIGS. 1A, 1B, 1C, 1D, 1E, and 1F to FIGS. 18A, 18B, 18C, 18D, 18E, and 18F are demonstrative illustrations of various cross-sectional views and top views of a transistor structure during a process of manufacturing the transistor structure, according to some embodiments of present invention.

Figure 2A:
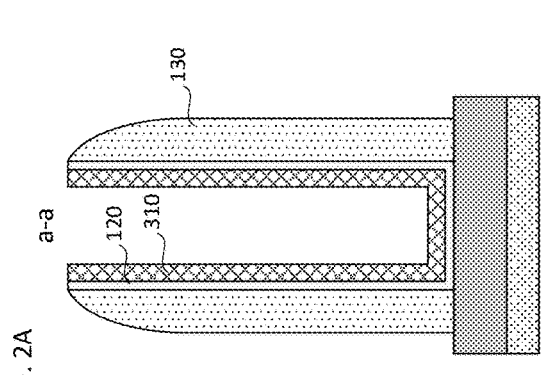
Figure 2B:
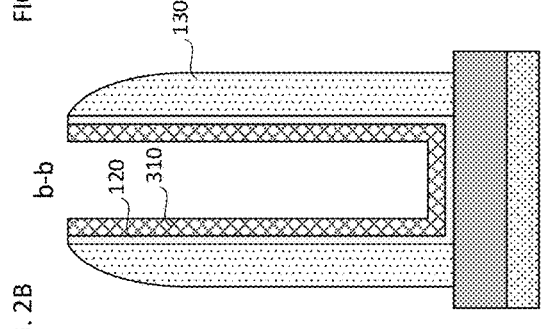
Figure 2C:
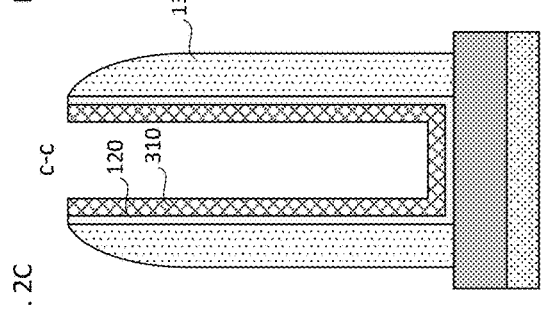
Figure 2D:
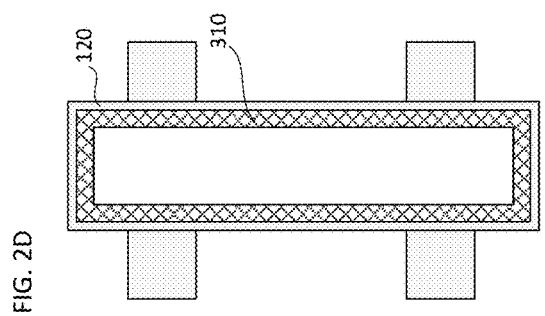
Figure 2E:
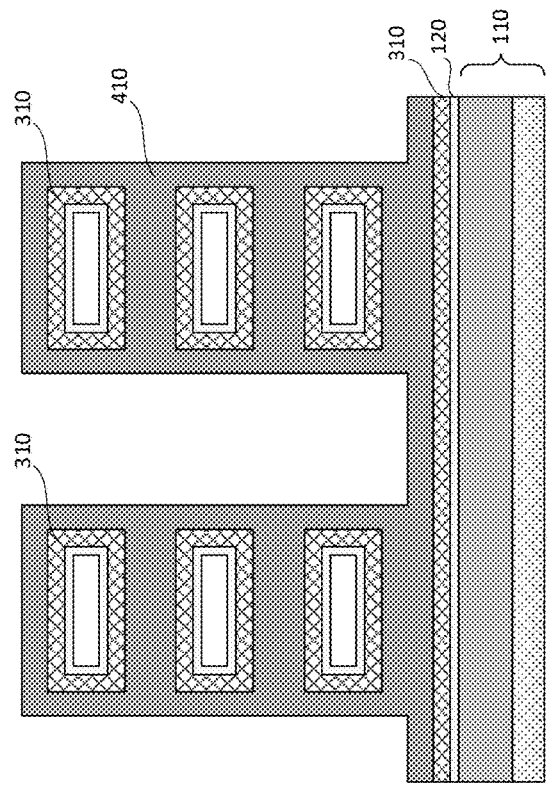
Figure 2F:
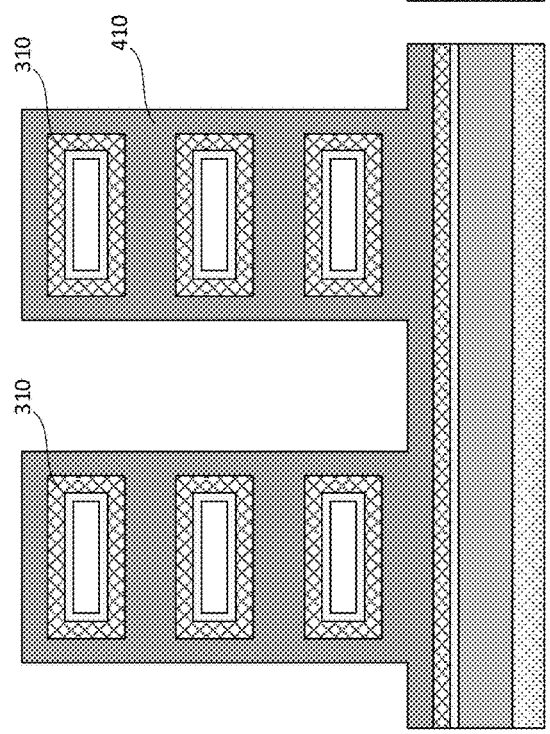
Figure 4A:
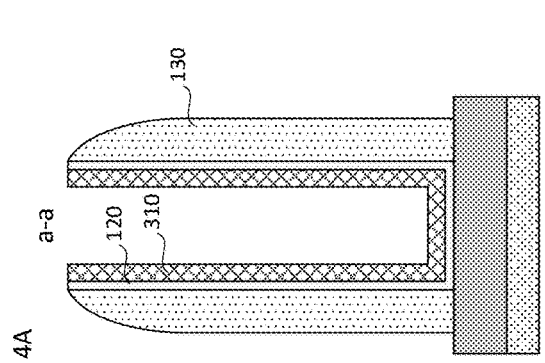
Figure 4B:
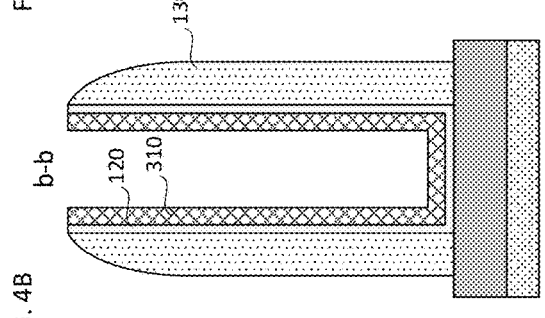
Figure 4C:
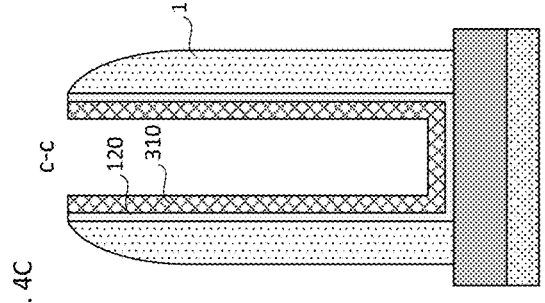
Figure 4D:
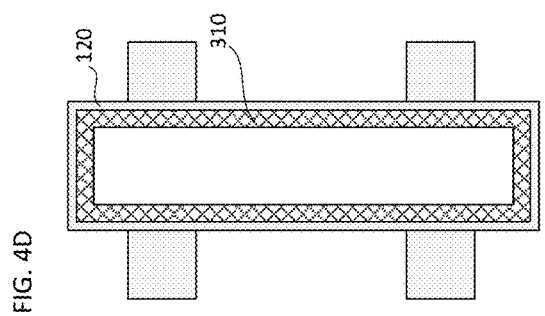
Figure 4E:
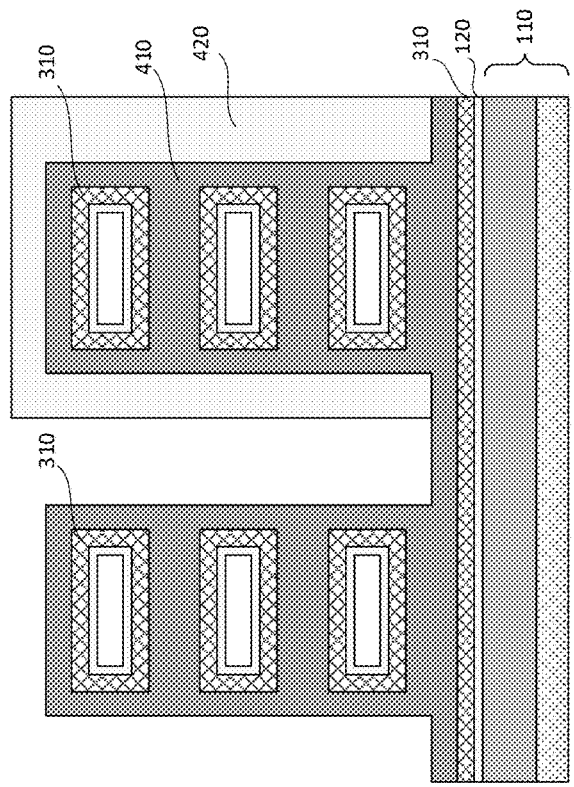
Figure 4F:
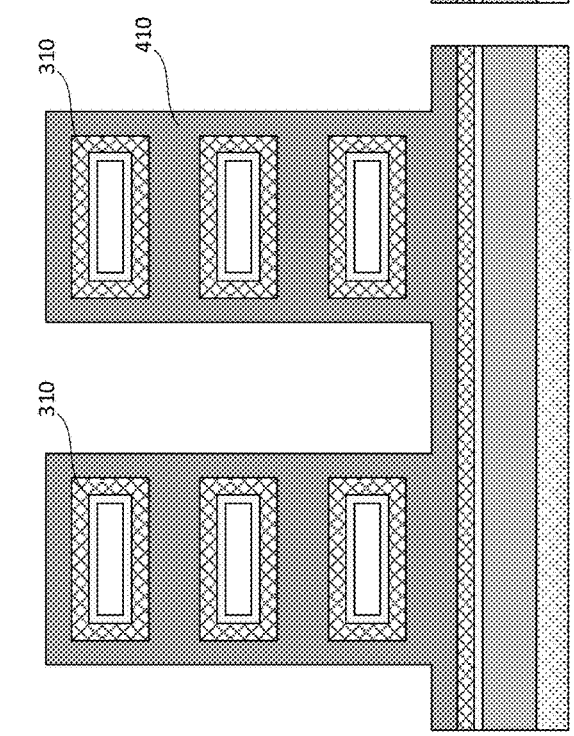
Figure 7A:
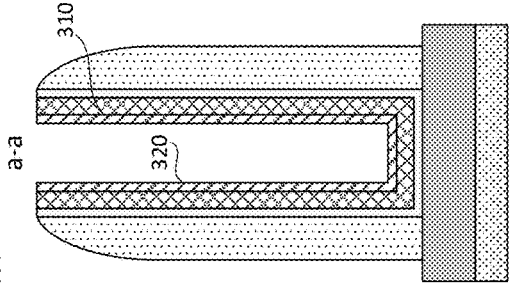
Figure 7B:
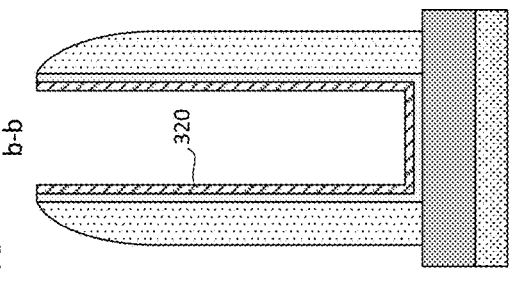
Figure 7C:
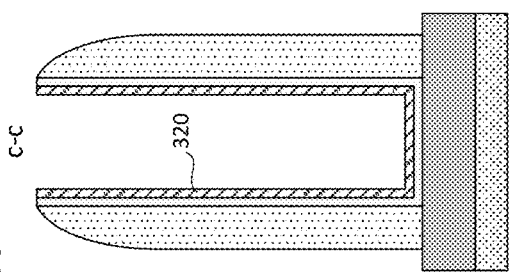
Figure 7D:
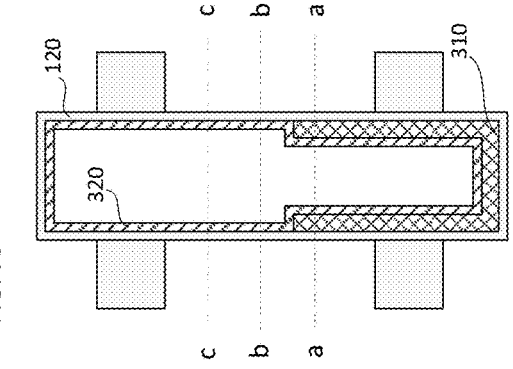
Figure 7E:
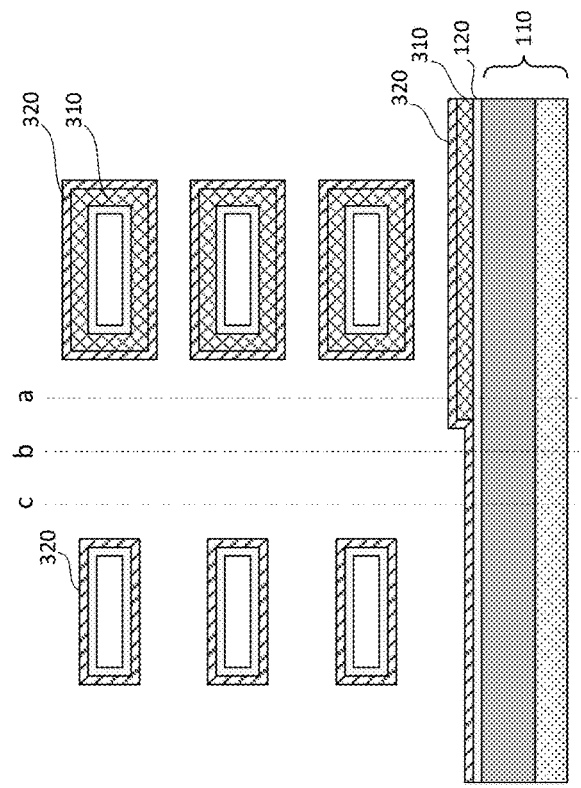
Figure 7F:
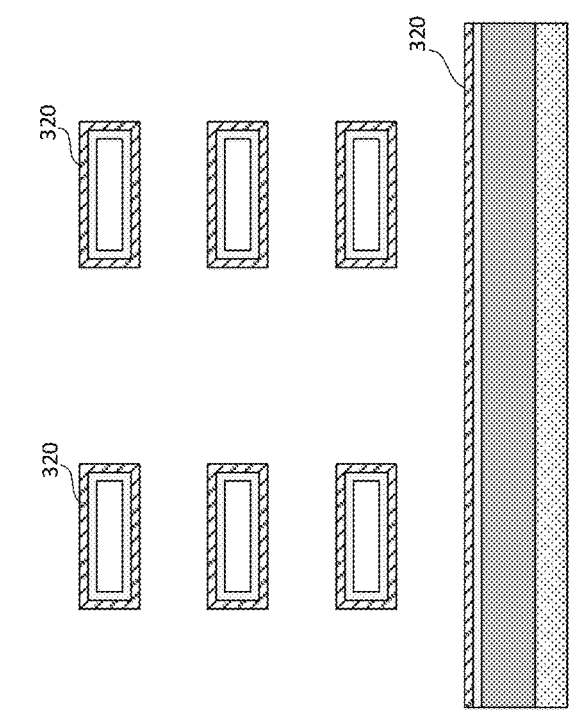
Figure 13A:
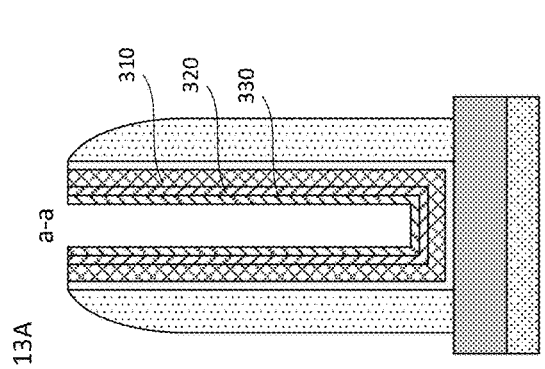
Figure 13B:
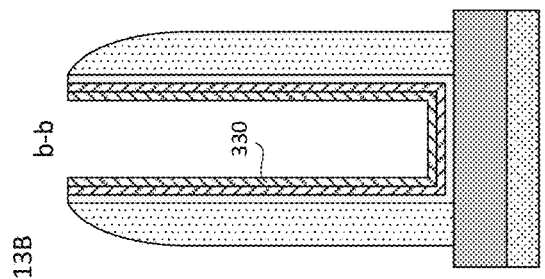
Figure 13C:
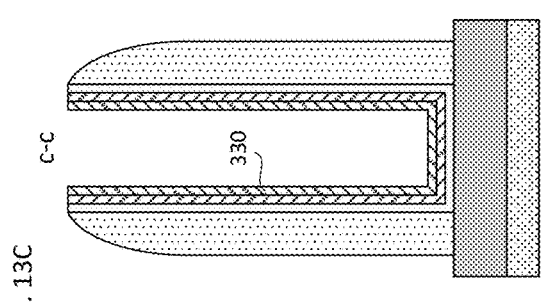
Figure 13D:
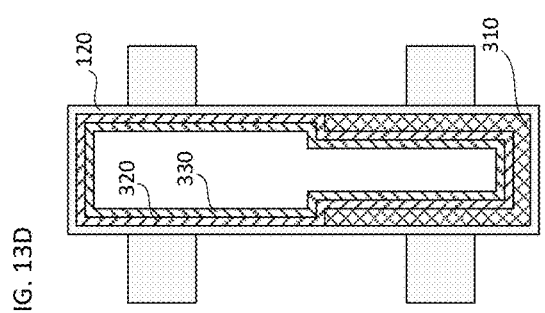
Figure 13E:
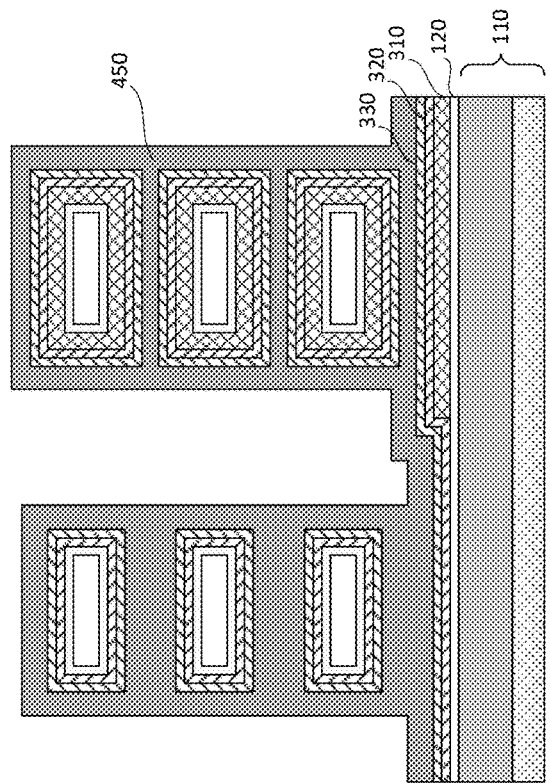
Figure 13F:
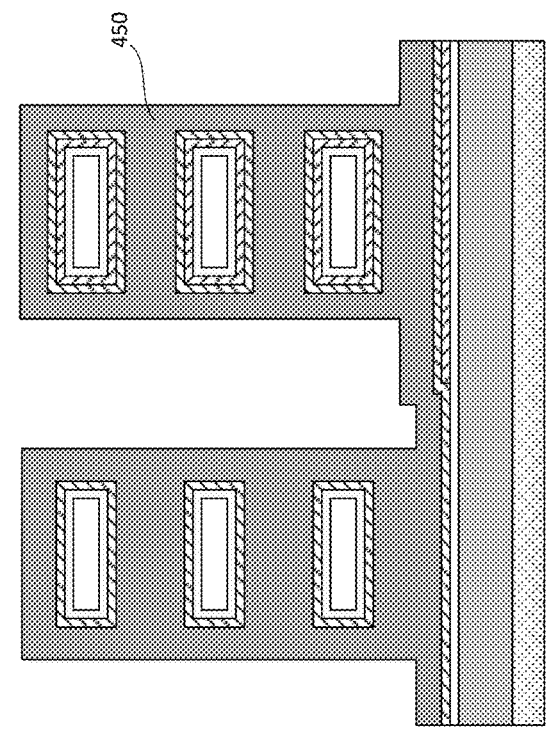
Figure 15A:
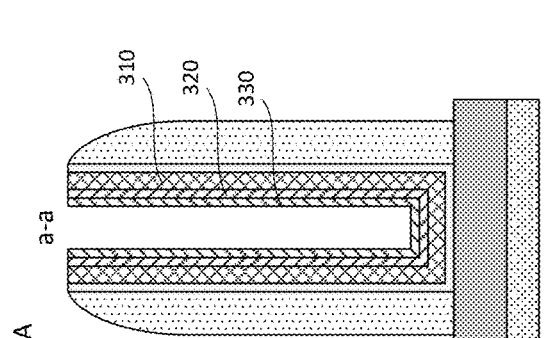
Figure 15B:
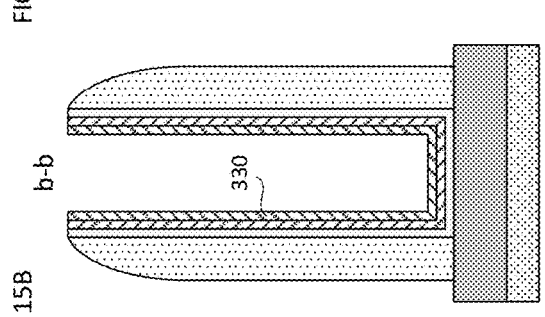
Figure 15C:
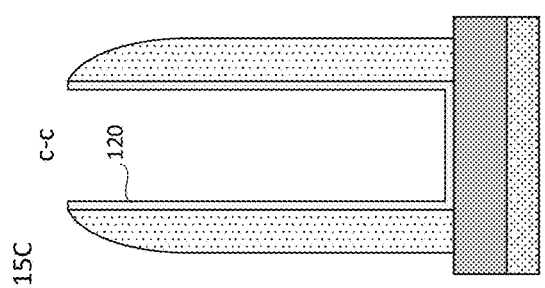
Figure 15D:
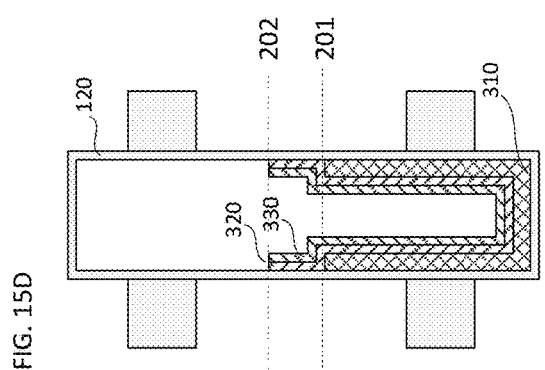
Figure 15E:
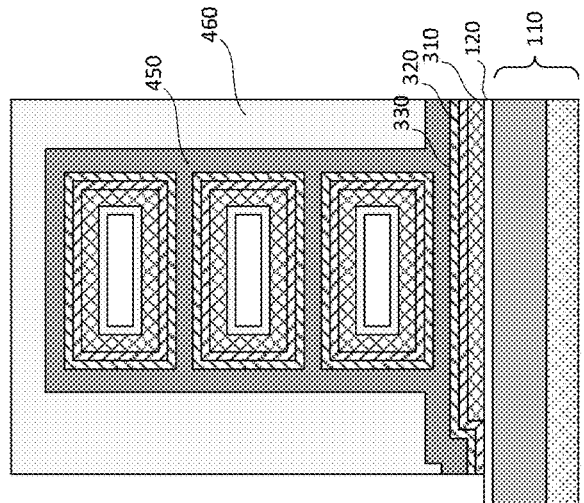
Figure 15F:
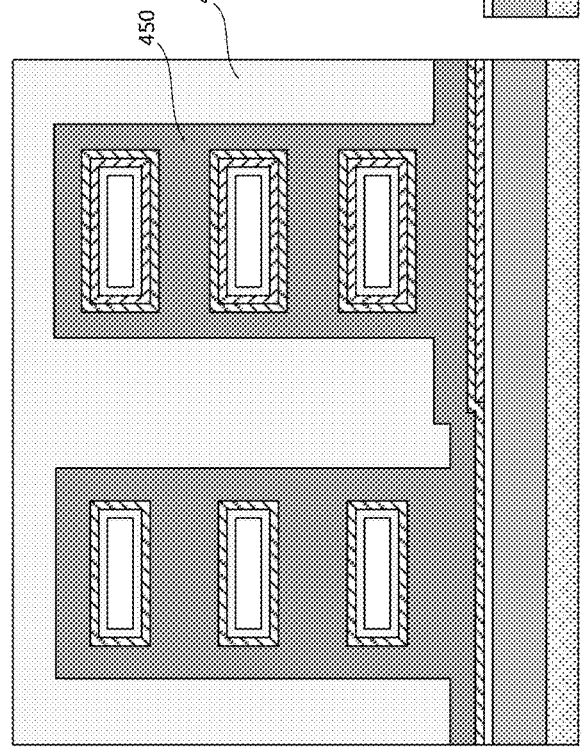
Figure 16A:
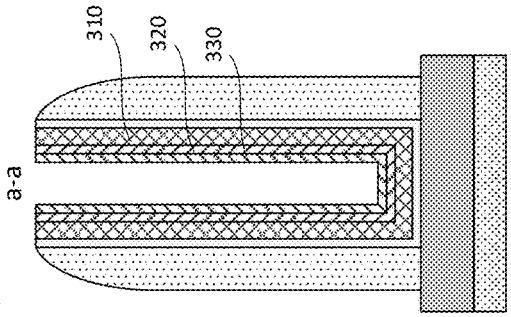
Figure 16B:
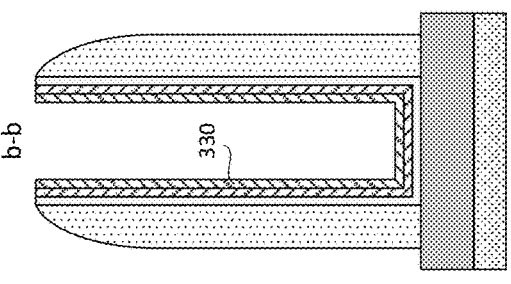
Figure 16C:
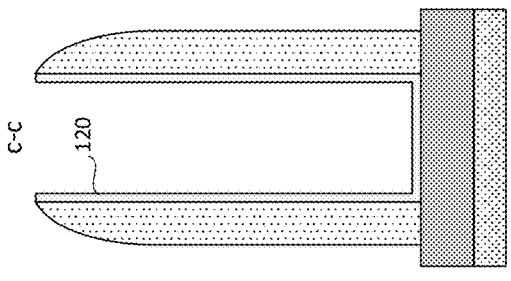
Figure 16D:
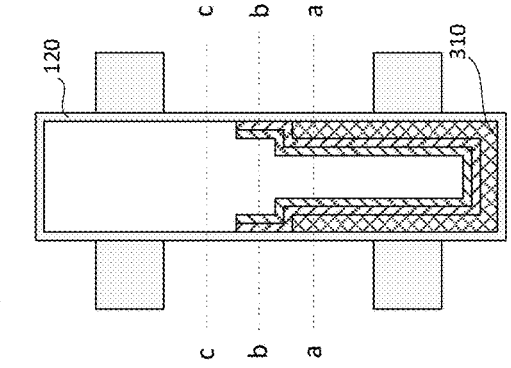
Figure 16E:
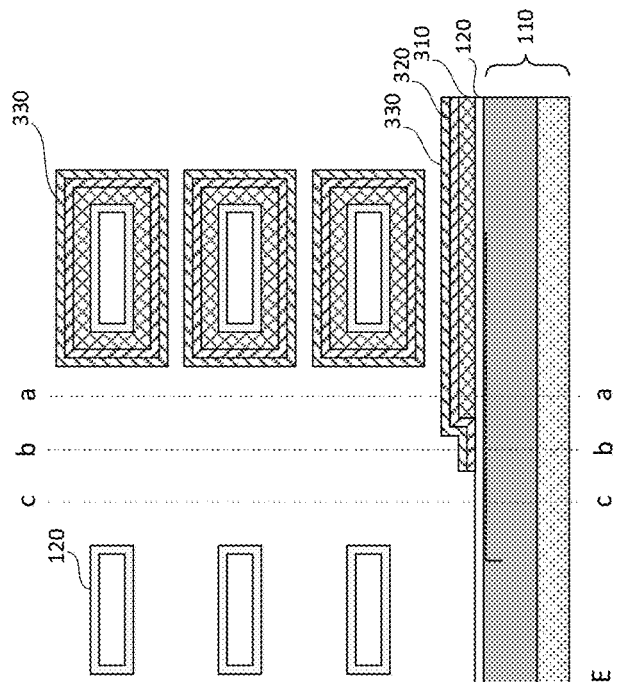
Figure 16F:
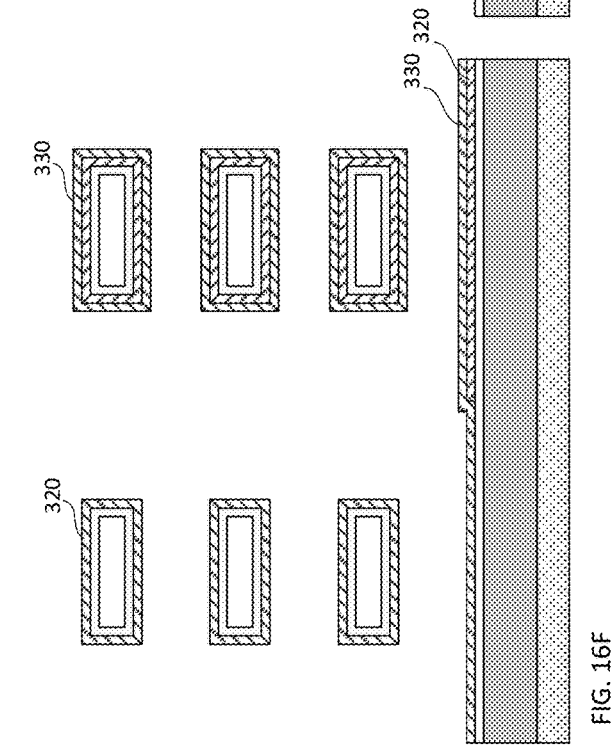

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, the same or similar reference numbers are used throughout the drawings to denote the same or similar features, elements, or structures, and thus, a detailed explanation of the same or similar features, elements, or structures may not be repeated for each of the drawings for economy of description.

FIGS. 1A, 1B, 1C, 1D, 1E and 1F are demonstrative illustrations of cross-sectional views and a top view of a transistor structure during a process of manufacturing thereof, according to some embodiments of present invention.

More specifically, FIGS. 1A, 1B, and 1C demonstratively illustrate cross-sectional views of a transistor structure 10 along dashed lines a-a, b-b, and c-c respectively. Dashed lines a-a, b-b, and c-c are provided in FIG. 1D of a top view of the transistor structure 10 and in FIG. 1E of a cross-sectional view of the transistor structure 10. Cross-sectional views along dashed lines a-a, b-b, and c-c are taken in an across-gate direction, but off the gate region, and illustrate cross-sections in an area between a first transistor 210 and a second transistor 220 of the transistor structure 10. The first and second transistors 210 and 220 are adjacent to each other.

FIG. 1D demonstratively illustrates a top view of the transistor structure 10 that includes the first transistor 210 and the second transistor 220. Dashed lines a-a, b-b, and c-c are provided to indicate locations where cross-sectional views are taken, which are illustrated in FIGS. 1A, 1B, and 1C.

FIG. 1E demonstratively illustrates a cross-sectional view of the transistor structure 10 that includes the first transistor 210 and the second transistor 220. The cross-sectional view is taken along a gate direction at a dashed line d-d as provided in FIG. 1D. FIG. 1F demonstratively illustrates a cross-sectional view of a third transistor 230 and a fourth transistor 240 of the transistor structure 10 along a gate direction. The third and fourth transistors 230 and 240 are adjacent to each other but may not be immediately next to the first and second transistors 210 and 220.

FIGS. 2A, 2B, 2C, 2D, 2E, and 2F to FIGS. 18A, 18B, 18C, 18D, 18E, and 18F, as being described hereinafter in more details, provide cross-sectional views and a top view of the transistor structure 10 at various manufacturing stages in a manner that is similar to FIGS. 1A, 1B, 1C, 1D, 1E, and 1F. In other words, drawings labeled with a same suffix "A", "B", "C", "D", "E", or "E" denote a same cross-sectional view or top view of the transistor structure 10 at various manufacturing stages. Although various reference numerals may be used across different drawings, same or similar reference numerals may be used for referencing to the same or similar elements in different drawings. Labelling for the same or similar elements in some drawings may be omitted in order not to overcrowd the drawings. Hereinafter, FIGS. 1A, 1B, 1C, 1D, 1E, and 1F may be collectively referred to as FIG. 1. Similarly, FIGS. 2A, 2B, 2C, 2D, 2E, and 2F may be collectively referred to as FIG. 2. So are the rest of drawings including FIGS. 3A-3F to FIGS. 18A-18F.

In the above, and hereinafter, nanosheet transistors (and with each having three nanosheets) will be used to demonstratively illustrate the manufacturing process of the transistor structure 10. However, the use of nanosheet transistors is merely illustrative. Embodiments of present invention are not limited to nanosheet transistors. For example, embodiments of present invention may be similarly applied to forming transistor structures of other types of transistors such as, for example, fin-type FET transistors (FinFET), vertical transistors (VFET), and/or planar transistors, as a person skilled in the art will readily appreciate.

Reference is made back to FIG. 1. Embodiments of present invention provide forming the transistor structure 10 that includes a set of transistors on top of a substrate 110. The substrate 110 may be a silicon-on-insulator (SOI) substrate or any other suitable substrate such as, for example, a bulk silicon (Si) substrate or a silicon-germanium-on-insulator (SGOI) substrate. The set of transistors may include the first transistor 210 having a first gate structure 211 formed from a first gate region 212 (e.g., a set of nanosheets), the second transistor 220 having a second gate structure 221 formed from a second gate region 222, the third transistor 230 having a third gate structure 231 formed from a third gate region 232, and the fourth transistor 240 having a fourth gate structure 241 formed from a fourth gate region 242.

In one embodiment, the first transistor 210 is a low-threshold p-type transistor, the second transistor 220 is a low-threshold n-type transistor, the third transistor 230 is a high-threshold p-type transistor, and the fourth transistor 240 is a high-threshold n-type transistor. Here, the word "low" and "high" are used in their relative terms, and to only denote that the first and second transistors 210 and 220 illustrated in FIG. 1E have lower threshold, when being compared respectively with threshold of the third and fourth transistors 230 and 240 illustrated in FIG. 1F.

Embodiments of present invention provide forming a layer 120 of gate dielectric, which may include a high-k dielectric material layer and an interfacial layer, surrounding the first, second, third and fourth gate regions 212, 222, 232, and 242. The layer 120 of gate dielectric may also line inner sidewalls of sidewall spacers 130 of the first, second, third, and fourth gate structures 211, 221, 231, and 241.

FIGS. 2A, 2B, 2C, 2D, 2E, and 2F are demonstrative illustrations of cross-sectional views and a top view of the transistor structure 10 during a process of manufacturing thereof, following the step illustrated in FIG. 1, according to some embodiments of present invention. More specifically, embodiments of present invention provide forming a first layer 310 of a first work-function metal surrounding the first, second, third, and fourth gate regions 212, 222, 232, and 242 above the gate dielectric layer 120. The first work-function metal of the first layer 310 may be, for example, metal nitride such as titanium-nitride (TiN), tantalum-nitride (TaN), tungsten-nitride (WN), molybdenum-nitride (MoN), niobium-nitride (NbN) or metal carbide such as titanium-carbide (TiC), tantalum-carbide (TaC), tungsten-carbide (WC), aluminum-carbide (AlC). The first layer 310 of the first work-function metal may be deposited through, for example, an atom layer deposition (ALD) process and may be deposited to have a thickness ranging from about 0.5 nm to about 2 nm. The first layer 310 of the first work-function metal may also line inner sidewalls of the sidewall spacers 130, over the layer 120 of gate dielectric, as being illustrated in FIGS. 2A-2D.

The first layer 310 of the first work-function metal may form a horizontal gap, as is illustrated in FIGS. 2A-2D, between the sidewall spacers 130 of the first gate structure 211. In one embodiment, the gap horizontally formed by the first layer 310 of the first work-function metal may be sufficiently large such that an organic planarization layer (OPL) is able to substantially fill up the gap without creating void, enabling the patterning and selective etching process as being described below in more details.

Following the deposition of the first layer 310 of the first work-function metal, embodiments of present invention provide depositing a sacrificial material layer 410 on top of the first layer 310 of the first work-function metal to cover the first, second, third, and fourth gate structures 211, 221, 231, and 241. The sacrificial material layer 410 may be a conformal layer to have a thickness from about 1 nm to about 3 nm. The sacrificial material may include, for example, oxide. However, other types of suitable sacrificial material may be used as well to cover and protect the first, second, third, and fourth gate structures 211, 221, 231, and 241. The sacrificial material layer 410 may be deposited to fill, vertically, in-between the nanosheets such that in a next step of the patterning process where an organic planarization layer may be used, the organic planarization layer will not get vertically in-between the nanosheets.

Hereinafter, for the clarity of illustration without overcrowding the drawings, process related materials (that may be deposited and later completely removed) such as, for example, sacrificial material layers and organic planarization layers may be illustrated only in cross sectional views along the gate direction, i.e., in drawings labelled with a suffix "E" and "F". Cross sectional views along the across-gate direction, i.e., drawings labelled with a suffix "A", "B", and "C" and top view, i.e., drawing labelled with a suffix "D" may be used to illustrate only the various layers of work-function metals. In other words, process related materials, such as sacrificial material layers and organic planarization layers, that are deposited and later completely removed may be omitted and not shown in drawings with a suffix "A", "B", "C", and "D".

FIGS. 3A, 3B, 3C, 3D, 3E, and 3F are demonstrative illustrations of cross-sectional views and a top view of the transistor structure 10 during a process of manufacturing thereof, following the step illustrated in FIG. 2, according to some embodiments of present invention. More specifically, embodiments of present invention provide depositing an organic planarization layer (OPL) 420 covering the first, second, third, and fourth gate structures 211, 221, 231, and 241. In particular, the OPL 420 is able to fill a gap horizontally formed by the first layer 310 of the first work-function metal between the sidewall spacers 130 of the first gate structure 211 without creating any void. The OPL 420 thereby protects the sacrificial material layer 410 and the first layer 310 of the first work-function metal during a subsequent patterning and etching process. The deposition of the OPL 420 may be followed by a planarization process using, for example, a chemical-mechanic-polishing (CMP) process to prepare a planarized top surface of transistor structure 10 for a next processing step such as a lithographic patterning process.

FIGS. 4A, 4B, 4C, 4D, 4E, and 4F are demonstrative illustrations of cross-sectional views and a top view of the transistor structure 10 during a process of manufacturing thereof, following the step illustrated in FIG. 3, according to some embodiments of present invention. More specifically, embodiments of present invention provide applying a lithographic patterning process to pattern the OPL 420. Particularly, portions of the OPL 420 that cover the second, third and fourth gate structures 221, 231, and 241 may be removed to expose underneath the sacrificial layer 410, leaving only a portion of the OPL 420 to cover the first gate structure 211.

FIGS. 5A, 5B, 5C, 5D, 5E, and 5F are demonstrative illustrations of cross-sectional views and a top view of the transistor structure 10 during a process of manufacturing thereof, following the step illustrated in FIG. 4, according to some embodiments of present invention. More specifically, embodiments of present invention provide, while using the OPL 420 to protect the first gate structure 211, removing the exposed sacrificial material layer 410 that covers the second, third, and fourth gate structures 221, 231, and 241. Following the removal of the sacrificial material layer 410, the exposed portions of the first layer 310 of the first work-function metal that cover the second, third, and fourth gate regions 222, 232, and 242 may be removed resulting in truncation of the first layer 310 of the first work-function metal at a first boundary 201. As is illustrated in FIG. 5D, the first boundary 201 is situated between the first transistor 210 and the second transistor 220.

FIGS. 6A, 6B, 6C, 6D, 6E, and 6F are demonstrative illustrations of cross-sectional views and a top view of the transistor structure 10 during a process of manufacturing thereof, following the step illustrated in FIG. 5, according to some embodiments of present invention. More specifically, after the sacrificial material layer 410 and the first layer 310 of the first work-function metal have been removed from the second, third and fourth gate structures 221, 231, and 241, embodiments of present invention provide selectively removing the OPL 420 and the sacrificial material layer 410 that cover the first gate structure 211 to expose the first layer 310 of the first work-function metal that covers the first gate region 212.

FIGS. 7A, 7B, 7C, 7D, 7E, and 7F are demonstrative illustrations of cross-sectional views and a top view of the transistor structure 10 during a process of manufacturing thereof, following the step illustrated in FIG. 6, according to some embodiments of present invention. More specifically, embodiments of present invention provide forming a second layer 320 of a second work-function metal surrounding the first, second, third, and fourth gate regions 212, 222, 232, and 242. More particularly, the second layer 320 of the second work-function metal may be formed above the first layer 310 of the first work-function metal in the first gate region 212 and may be formed directly above the layer 120 of gate dielectric in the second, third, and fourth gate regions 222, 232, and 242. The second work-function metal of the second layer 320 may be, for example, metal nitride such as TiN, TaN, WN, MoN, NbN or metal carbide such as TiC, TaC, WC, AlC. The second layer 320 of the second work-function metal may be deposited through, for example, an ALD process and may be deposited to have a thickness ranging from about 0.5 nm to about 2 nm. The second layer 320 of the second work-function metal may also be deposited on top of the first layer 310 of the first work-function metal between the sidewall spacers 130 of the first gate structure 211 as being illustrated in FIGS. 7A-7D.

FIGS. 8A, 8B, 8C, 8D, 8E, and 8F are demonstrative illustrations of cross-sectional views and a top view of the transistor structure 10 during a process of manufacturing thereof, following the step illustrated in FIG. 7, according to some embodiments of present invention. More specifically, following the deposition of the second layer 320 of the second work-function metal, embodiments of present invention provide depositing a sacrificial material layer 430 on top of the second layer 320 of the second work-function metal to cover the first, second, third, and fourth gate structures 211, 221, 231, and 241. The sacrificial material layer 430 may be a conformal layer to have a thickness from about 1 nm to about 3 nm. The sacrificial material may include, for example, oxide. However, other types of suitable sacrificial material may be used as well to cover and protect the first, second, third, and fourth gate structures 211, 221, 231, and 241.

FIGS. 9A, 9B, 9C, 9D, 9E, and 9F are demonstrative illustrations of cross-sectional views and a top view of the transistor structure 10 during a process of manufacturing thereof, following the step illustrated in FIG. 8, according to some embodiments of present invention. More specifically, embodiments of present invention provide depositing an organic planarization layer (OPL) 440 that is subsequently patterned to cover the first, second, and third gate structures 211, 221, and 231 and leave the fourth gate structure 241 exposed. In particular, the OPL 440 is able to fill a gap horizontally formed by the second layer 320 of the second work-function metal between the sidewall spacers 130 of the first gate structure 211 without creating any void. The OPL 440 thereby protects the sacrificial material layer 430, the second layer 320 of the second work-function metal, and the first layer 310 of the first work-function metal during the patterning thereof to expose the fourth gate structure 241.

FIGS. 10A, 10B, 10C, 10D, 10E, and 10F are demonstrative illustrations of cross-sectional views and a top view of the transistor structure 10 during a process of manufacturing thereof, following the step illustrated in FIG. 9, according to some embodiments of present invention. More specifically, embodiments of present invention provide, while using the OPL 440 to protect the first, second, and third gate structures 211, 221, and 231, removing the exposed sacrificial material layer 430 that covers the fourth gate structure 241. Following the removal of the sacrificial material layer 430, exposed portion of the second layer 320 of the second work-function metal that covers the fourth gate region 242 may be removed resulting in truncation of the second layer 320 of the second work-function metal at a boundary between the third and fourth gate structures 231 and 241.

FIGS. 11A, 11B, 11C, 11D, 11E, and 11F are demonstrative illustrations of various cross-sectional views and a top view of the transistor structure 10 during a process of manufacturing the transistor structure, following the step illustrated in FIG. 10, according to some embodiments of present invention. More specifically, after the sacrificial material layer 430 and the second layer 320 of the second work-function metal have been removed from the fourth gate structure 241, embodiments of present invention provide selectively removing the OPL 440 and the sacrificial material layer 430 that cover the first, second, and third gate structures 211, 221, and 231 to expose the second layer 320 of the second work-function metal that covers the first, second, and third gate regions 212, 222, and 232.

FIGS. 12A, 12B, 12C, 12D, 12E, and 12F are demonstrative illustrations of cross-sectional views and a top view of the transistor structure 10 during a process of manufacturing thereof, following the step illustrated in FIG. 11, according to some embodiments of present invention. More specifically, embodiments of present invention provide forming a third layer 330 of a third work-function metal surrounding the first, second, third, and fourth gate regions 212, 222, 232, and 242. More particularly, the third layer 320 of the third work-function metal may be formed above the second layer 320 of the second work-function metal in the first, second, and third gate regions 212, 222, and 232 and may be formed directly above the layer 120 of gate dielectric in the fourth gate region 242. The third work-function metal of the third layer 330 may be, for example, metal nitride such as TiN, TaN, WN, MoN, NbN or metal carbide such as TiC, TaC, WC, AlC. The third layer 320 of the third work-function metal may be deposited through, for example, an ALD process and may be deposited to have a thickness ranging from about 0.5 nm to about 2 nm. The third layer 330 of the third work-function metal may also be deposited on top of the second layer 320 of the second work-function metal between the sidewall spacers 130 of the first gate structure 211 as being illustrated in FIGS. 12A-12D.

FIGS. 13A, 13B, 13C, 13D, 13E, and 13F are demonstrative illustrations of various cross-sectional views and a top view of the transistor structure 10 during a process of manufacturing the transistor structure, following the step illustrated in FIG. 12, according to some embodiments of present invention. More specifically, following the deposition of the third layer 330 of the third work-function metal, embodiments of present invention provide depositing a sacrificial material layer 450 on top of the third layer 330 of the third work-function metal to cover the first, second, third, and fourth gate structures 211, 221, 231, and 241. The sacrificial material layer 450 may be a conformal layer to have a thickness from about 1 nm to about 3 nm. The sacrificial material may include, for example, oxide. However, other types of suitable sacrificial material may be used as well to cover and protect the first, second, third, and fourth gate structures 211, 221, 231, and 241.

FIGS. 14A, 14B, 14C, 14D, 14E, and 14F are demonstrative illustrations of various cross-sectional views and a top view of the transistor structure 10 during a process of manufacturing the transistor structure, following the step illustrated in FIG. 13, according to some embodiments of present invention. More specifically, embodiments of present invention provide depositing an organic planarization layer (OPL) 460 that is subsequently patterned to cover the first, third, and fourth gate structures 211, 231, and 241 and leave the second gate structure 221 exposed.

In one embodiment, a gap formed by the third layer 330 of the third work-function metal between the sidewall spacers 130, in an area directly above the first gate region 212 of first transistor 210, is sufficiently narrow to cause the OPL 460 to pinch off and not able to fill the gap without creating void. On the other hand, because of the truncation of the first layer 310 of the first work-function metal at the first boundary 201, a gap formed by the third layer 330 of the third work-function metal in an area between the first boundary 201 and the second transistor 220 is sufficiently large such that the OPL 460 is able to substantially fill up the gap between the first boundary 201 and the second transistor 220 without creating void.

According to embodiments of present invention, when the third layer 330 of the third work-function metal and the second layer 320 of the second work-function metal are to be truncated at a second boundary 202 (FIG. 15), and when the second boundary 202 is to be made or situates between the first boundary 201 and the second transistor 220, the OPL 460 is able to fully cover the first gate structure 211 at the second boundary 202. In other words, a distance between truncated ends of the third layer 330 of the third work-function metal, when viewed from a top of the first gate structure 211, is larger than a gap horizontally formed by the third layer 330 of the third work-function metal directly above the first gate region 212 of the first transistor 210. The distance between truncated ends of the third layer 330 of the third work-function metal is sufficiently large to allow the OPL 460 to fill between the truncated ends without creating void. The OPL 460 thereby protects the sacrificial material layer 450, the third layer 330 of the third work-function metal, the second layer 320 of the second work-function metal, and the first layer 310 of the first work-function metal that cover the first gate region 212 of the first transistor 210, during a process to expose the second gate structure 221.

In the above, it is demonstratively illustrated that there are two layers of work-function metals, the layer 330 and the layer 320, in the area between the first boundary 201 and the second transistor 220. However, embodiments of present invention are not limited in this aspect. As a person skilled in the art will appreciate that, depending upon the number of and the types of transistors being formed, the number of work-function layers in the area between the first boundary 201 and the second transistor 220 may be more or less than two. Furthermore, for the same reason, the number of work-function metal layers being truncated at first boundary 201 may be more than one.

FIGS. 15A, 15B, 15C, 15D, 15E, and 15F are demonstrative illustrations of various cross-sectional views and a top view of the transistor structure 10 during a process of manufacturing the transistor structure, following the step illustrated in FIG. 14, according to some embodiments of present invention. More specifically, embodiments of present invention provide, while using the OPL 460 to protect the first, third, and fourth gate structures 211, 231, and 241, removing the exposed sacrificial material layer 450 that covers the second gate structure 221. Following the removal of the sacrificial material layer 450, exposed portion of the third layer 330 of the third work-function metal and underneath the second layer 320 of the second work-function metal that cover the second gate region 222 may be removed, resulting in truncation of the third layer 330 of the third work-function metal and the second layer 320 of the second work-function metal at the second boundary 202 between the first boundary 201 and the second transistor 220.

FIGS. 16A, 16B, 16C, 16D, 16E, and 16F are demonstrative illustrations of various cross-sectional views and a top view of the transistor structure 10 during a process of manufacturing the transistor structure, following the step illustrated in FIG. 15, according to some embodiments of present invention. More specifically, after the sacrificial material layer 450, the third layer 330 of the third work-function metal, and the second layer 320 of the second work-function metal have been removed from the second gate structure 221, embodiments of present invention provide selectively removing the OPL 460 and the sacrificial material layer 450 that cover the first, third, and fourth gate structures 211, 231, and 241 to expose the third layer 330 of the third work-function metal that covers the first, third, and fourth gate regions 212, 232, and 242.

FIGS. 17A, 17B, 17C, 17D, 17E, and 17F are demonstrative illustrations of various cross-sectional views and a top view of the transistor structure 10 during a process of manufacturing the transistor structure, following the step illustrated in FIG. 16, according to some embodiments of present invention. More specifically, embodiments of present invention provide forming a fourth layer 340 of a fourth work-function metal surrounding first, second, third, and fourth gate regions 212, 222, 232, and 242. More particularly, the fourth layer 340 of the fourth work-function metal may be formed above the third layer 330 of the third work-function metal in the first, third, and fourth gate regions 212, 232, and 242 and may be formed directly above the layer 120 of gate dielectric in the second gate region 222. The fourth work-function metal of the fourth layer 340 may be, for example, metal nitride such as TiN, TaN, WN, MoN, NbN or metal carbide such as TiC, TaC, WC, AlC. The fourth work-function metal of the fourth layer 340 may be deposited through, for example, an ALD process and may be deposited to have a thickness ranging from about 0.5 nm to about 2 nm. The fourth layer 340 of the fourth work-function metal may also be deposited on top of the third layer 330 of the third work-function metal between the sidewall spacers 130 of the first gate structure 211 as being illustrated in FIGS. 17A-17D. In one embodiment, the fourth layer 340 of the fourth work-function metal may pinch-off vertically between the nanosheets of the first transistor 210, thereby preventing subsequently deposited n-type work-function metal from filling in-between the nanosheets of the first transistor 210, which would otherwise cause threshold of the first transistor 210 to increase, resulting a relatively low threshold of the first transistor 210.

FIGS. 18A, 18B, 18C, 18D, 18E, and 18F are demonstrative illustrations of various cross-sectional views and a top view of the transistor structure 10 during a process of manufacturing the transistor structure, following the step illustrated in FIG. 17, according to some embodiments of present invention. More specifically, a layer 510 of work-function metal is deposited on top of the fourth layer 340 of the fourth work-function metal to form metal gates of the first, second, third, and fourth transistors 210, 220, 230, and 240. The layer 510 of work-function metal could be one work-function metal layer such as titanium-aluminum-carbide (TiAlC), titanium-aluminum (TiAl), aluminum (Al), titanium (Ti), tungsten (W) or a stack of multiple work-function metal layers to include elements of, for example, Al, Ti, and/or W. For example, the stack could be a TiN/TiAlC/TiN tri-layer stack or a WN/TiAl/TiN tri-layer stack. The layer 510 may be used to define, modify, and/or influence threshold voltage Vt of the devices. For example, in one embodiment, layer 510 of work-function metal may not be formed vertically between nanosheets of the first transistor 210 when the vertical gap between nanosheets of the first transistor 210 is pinched-off by the fourth layer 340 of the fourth work-function metal such that a relatively low threshold p-type first transistor 210 may be formed.

Figure 19:
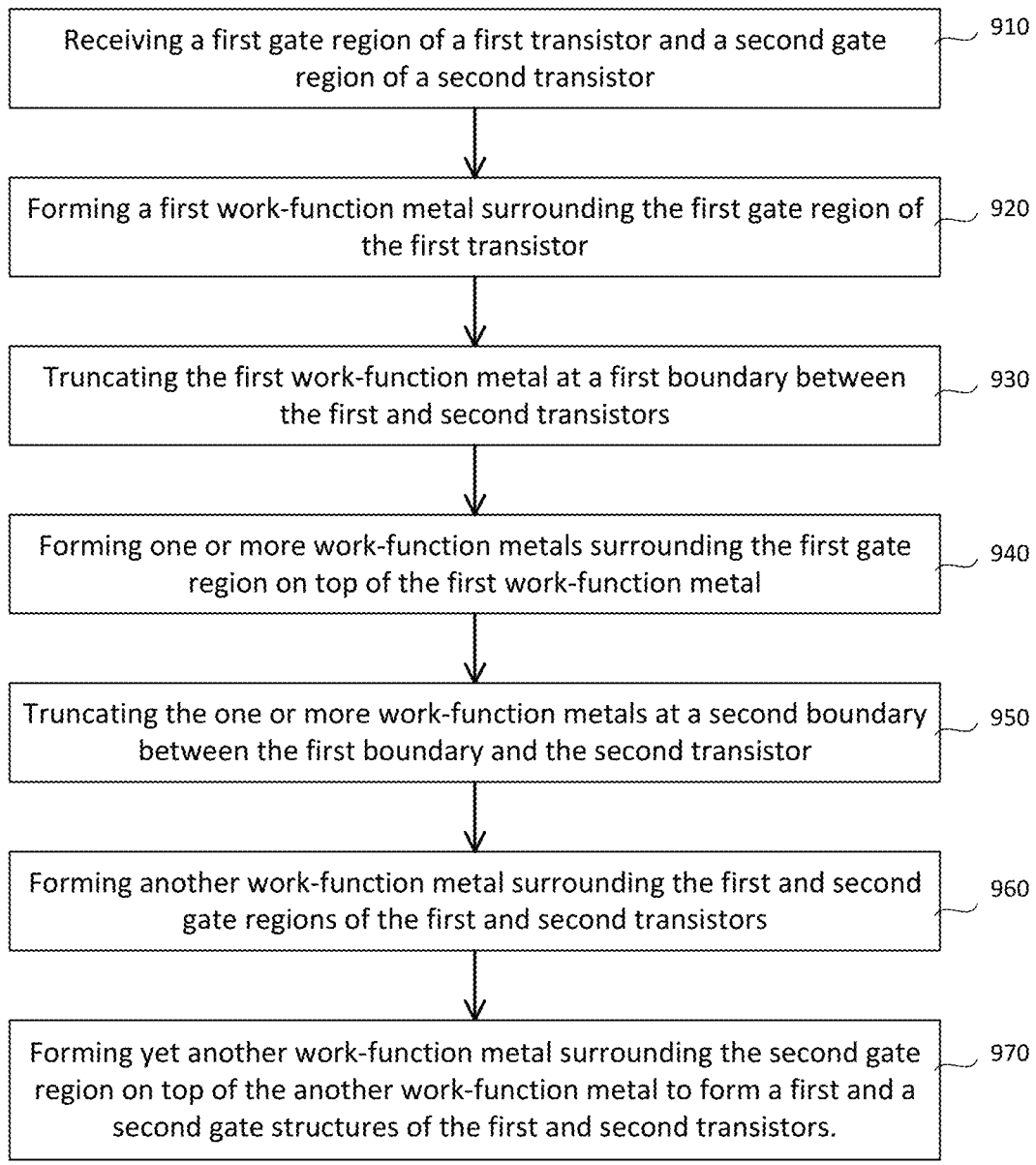
FIG. 19 is a demonstrative illustration of a flow-chart of a method of manufacturing a transistor structure according to embodiments of present invention.

FIG. 19 is a demonstrative illustration of a flow-chart of a method of manufacturing a transistor structure according to embodiments of present invention. The method includes (910) receiving a first gate region of a first transistor and a second gate region of a second transistor, with the first and second gate regions to be formed into first and second gate structures; (920) forming a first work-function metal surrounding the first gate region of the first transistor; (930) truncating the first work-function metal at a first boundary between the first and second transistors; (940) forming one or more work-function metals surrounding the first gate region on top of the first work-function metal; (950) truncating the one or more work-function metals at a second boundary between the first boundary and the second transistor; (960) forming another work-function metal surrounding the first and second gate regions of the first and second transistors; and (970) forming yet another work-function metal surrounding the second gate region on top of the another work-function metal to form a first and a second gate structures of the first and second transistors. In the above, the first work-function metal could be a first layer of work-function metal that has one or more sub-layers of more than one work-function metals. Similarly, the another work-function metal could be another layer of work-function metal that has one or more sub-layers of more than one work-function metals. The yet another work-function metal could be yet another layer of work-function metal that has one or more sub-layers of more than one work-function metals.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other higher-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A transistor structure comprising:
a first transistor having a first gate structure; and
the first gate structure having two or more work-function metals,
wherein one or more of the two or more work-function metals are truncated at a first boundary and a second boundary, the two or more work-function metals include a first work-function metal and a second work-function metal, the second work-function metal is formed on top of the first work-function metal, and a distance between two truncated ends of the second work-function metal, when viewed from a top of the first gate structure, is larger than a width of a gap formed by the second work-function metal, the gap being directly above a gate region of the first gate structure.

2. The transistor structure of claim 1, further comprising a second transistor adjacent to the first transistor, the second transistor having a second gate structure, wherein the first and second boundaries are between the first and second transistors.

3. The transistor structure of claim 2, wherein the first transistor is a p-type transistor, and the second transistor is an n-type transistor.

4. The transistor structure of claim 2, wherein the first work-function metal is truncated at the first boundary and the second work-function metal is truncated at the second boundary, the second boundary being between the first boundary and the second transistor.

5. The transistor structure of claim 4, wherein the distance between the two truncated ends of the second work-function metal is sufficiently large to allow an organic planarization layer to fill between the two truncated ends without creating a void.

6. The transistor structure of claim 4, wherein the width of the gap formed by the second work-function metal directly above the gate region of the first gate structure is sufficiently narrow to cause an organic planarization layer to pinch off and not able to fill the gap without creating a void.

7. The transistor structure of claim 4, wherein the two or more work-function metals further comprise one or more additional work-function metals between the first and second work-function metals, wherein the second work-function metal and one or more of the one or more additional work-function metals are truncated at the second boundary.

8. A method of forming a transistor structure, the method comprising:
  receiving a first gate region of a first transistor and a second gate region of a second transistor, the first transistor being adjacent to the second transistor;
  forming a first work-function metal surrounding the first gate region;
  truncating the first work-function metal at a first boundary between the first transistor and the second transistor;
  forming one or more work-function metals surrounding the first gate region;
  truncating the one or more work-function metals at a second boundary between the first boundary and the second transistor; and
  forming another work-function metal surrounding the first and second gate regions,
  wherein truncating the one or more work-function metals comprises selectively etching the one or more work-function metals between the second boundary and the second transistor with an organic planarization layer protecting the one or more work-function metals between the first boundary and the second boundary from being etched.

9. The method of claim 8, wherein truncating the one or more work-function metals comprises forming an organic planarization layer (OPL) in a gap formed by the one or more work-function metals in an area between the first boundary and the second boundary, the gap being sufficiently large such that the OPL is able to substantially fill up the gap without creating a void.

10. The method of claim 8, wherein a gap formed by the one or more work-function metals directly above the first gate region of the first transistor is sufficiently narrow to cause an organic planarization layer to pinch off and not able to fill the gap without creating a void.

11. The method of claim 8, wherein truncating the first work-function metal comprises forming an organic planarization layer (OPL) in a gap formed by the first work-function metal in an area between the first transistor and the first boundary, the gap being sufficiently large such that the OPL is able to substantially fill up the gap without creating a void.

12. A transistor structure comprising:
  a first transistor having a first gate region;
  a second transistor having a second gate region, the second transistor being adjacent to the first transistor;
  a first work-function metal surrounding the first gate region, the first work-function metal being truncated at a first boundary between the first transistor and the second transistor;
  a second work-function metal and a third work-function metal with both of which surrounding the first gate region, the second work-function metal being above the first work-function metal, the third work-function metal being above the second work-function metal, the second and third work-function metals being truncated at a second boundary between the first boundary and the second transistor; and
  a fourth work-function metal surrounding the first gate region and the second gate region and being above the third work-function metal.

13. The transistor structure of claim 12, further comprising:
  a third transistor having a third gate region; and
  a fourth transistor having a fourth gate region, the fourth transistor being adjacent to the third transistor,
  wherein the second and third work-function metals surrounding the third gate region of the third transistor, the second and third work-function metals being truncated at a third boundary between the third transistor and the fourth transistor, and wherein the third work-function metal surrounding the fourth gate region of the fourth transistor.

14. The transistor structure of claim 13, wherein the first transistor is a p-type transistor, the second transistor is an n-type transistor; the third transistor is a p-type transistor having a higher threshold voltage than the first transistor; and the fourth transistor is an n-type transistor having a higher threshold voltage than the second transistor.

15. The transistor structure of claim 13, wherein the first work-function metal is a metal nitride or a metal carbide including titanium-nitride (TiN), tantalum-nitride (TaN), tungsten-nitride (WN), molybdenum-nitride (MoN), niobium-nitride (NbN), titanium-carbide (TiC), tantalum-carbide (TaC), tungsten-carbide (WC), and aluminum-carbide (AlC).

16. The transistor structure of claim 13, wherein a distance between two truncated ends of the third work-function metal in an area between the first and second boundaries, when viewed from a top of the first gate region, is larger than a width of a gap formed by the third work-function metal with the gap being directly above the first gate region.

17. The transistor structure of claim 13, wherein a distance between two truncated ends of the third work-function metal is sufficiently large to allow an organic planarization layer to fill between the two truncated ends without creating a void.

18. The transistor structure of claim 13, wherein a width of a gap formed by the third work-function metal directly above the first gate region is sufficiently narrow to cause an organic planarization layer to pinch off and not able to fill the gap without creating a void.

* * * * *